US010340302B2

(12) United States Patent
Bolognia et al.

(10) Patent No.: US 10,340,302 B2
(45) Date of Patent: Jul. 2, 2019

(54) COMPACT SENSOR MODULE

(71) Applicant: ANALOG DEVICES, INC., Norwood, MA (US)

(72) Inventors: David Frank Bolognia, North Andover, MA (US); Vikram Venkatadri, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/805,835

(22) Filed: Jul. 22, 2015

(65) Prior Publication Data
US 2017/0025463 A1 Jan. 26, 2017

(51) Int. Cl.
H01L 27/146 (2006.01)
H01L 31/0203 (2014.01)
H01L 31/024 (2014.01)

(52) U.S. Cl.
CPC .. *H01L 27/14634* (2013.01); *H01L 27/14618* (2013.01); *H01L 27/14636* (2013.01); *H01L 27/14643* (2013.01); *H01L 27/14661* (2013.01); *H01L 31/0203* (2013.01); *H01L 31/024* (2013.01); *Y10T 29/49126* (2015.01)

(58) Field of Classification Search
CPC ....... H01L 27/14618; H01L 2225/1023; G01T 1/243; A61B 6/4411; A61B 6/4429
See application file for complete search history.

(56) References Cited

U.S. PATENT DOCUMENTS

| 3,553,030 | A | 1/1971 | Lebrun |
| 4,883,967 | A | 11/1989 | Tsutsui et al. |
| 5,487,098 | A * | 1/1996 | Dobbs .................... A61B 6/032 378/19 |
| 5,801,385 | A | 9/1998 | Endo et al. |
| 5,889,313 | A | 3/1999 | Parker |
| 6,300,679 | B1 | 10/2001 | Mukerji et al. |
| 6,323,891 | B1 | 11/2001 | Kitani et al. |
| 6,396,898 | B1 | 5/2002 | Saito et al. |
| 6,426,991 | B1 | 7/2002 | Mattson et al. |
| 6,476,417 | B2 | 11/2002 | Honda et al. |

(Continued)

FOREIGN PATENT DOCUMENTS

| JP | 2001-099942 | 4/2001 |
| JP | 2002-022841 | 1/2002 |

(Continued)

OTHER PUBLICATIONS

"Micromachining—Function in a Small Package", SSC00-X-3, to Fox et al., p. 1-7, available at http://digitalcommons.usu.edu/cgi/viewcontent.cgi?article=2100&content=smallsat.*

(Continued)

*Primary Examiner* — Kenneth J Malkowski
(74) *Attorney, Agent, or Firm* — Knobbe, Martens, Olson & Bear, LLP

(57) ABSTRACT

Various embodiments of a compact sensor module are disclosed herein. The sensor module can include a stiffener and a sensor substrate wrapped around a side of the stiffener. A sensor die may mounted on the sensor substrate. A processor substrate may be coupled to the sensor substrate. A processor die may be mounted on the processor substrate and may be in electrical communication with the sensor die.

21 Claims, 21 Drawing Sheets

(56) References Cited

U.S. PATENT DOCUMENTS

| | | | |
|---|---|---|---|
| 6,510,195 B1 | 1/2003 | Chappo et al. | |
| 6,573,506 B2 | 6/2003 | Sato et al. | |
| 6,601,947 B1 | 8/2003 | Sato et al. | |
| 7,067,817 B2 | 6/2006 | Suganuma et al. | |
| 7,189,971 B2 * | 3/2007 | Spartiotis | G01T 1/2928 250/370.09 |
| 7,193,218 B2 | 3/2007 | Nagano | |
| 7,202,482 B2 * | 4/2007 | Yokoi | G01T 1/2928 250/370.09 |
| 7,339,176 B2 * | 3/2008 | El-Hanany | G01T 1/2928 250/370.09 |
| 7,358,501 B2 | 4/2008 | Danzer et al. | |
| 7,468,514 B1 | 12/2008 | Suzuki et al. | |
| 7,504,637 B2 | 3/2009 | Thorne | |
| 7,504,701 B2 | 3/2009 | Moribayashi et al. | |
| 7,544,947 B2 | 6/2009 | Kerwin et al. | |
| 8,000,437 B2 * | 8/2011 | Kotooka | A61B 6/032 250/370.09 |
| 8,829,454 B2 | 9/2014 | Bolognia | |
| 8,859,975 B2 | 10/2014 | Tokura et al. | |
| 8,866,098 B2 | 10/2014 | Hayatsu et al. | |
| 9,171,878 B2 | 10/2015 | Yaoi et al. | |
| 9,835,733 B2 | 12/2017 | Ying | |
| 2002/0011572 A1 | 1/2002 | Kajiwara et al. | |
| 2002/0070343 A1 * | 6/2002 | Hoffman | G01T 1/2018 250/367 |
| 2002/0148968 A1 | 10/2002 | Der Haar | |
| 2002/0153492 A1 | 10/2002 | Sekine et al. | |
| 2003/0010924 A1 | 1/2003 | El-Hanany et al. | |
| 2003/0097875 A1 | 5/2003 | Lentz et al. | |
| 2004/0223583 A1 | 11/2004 | Tsujii | |
| 2005/0029463 A1 | 2/2005 | Kaemmerer | |
| 2005/0067178 A1 | 3/2005 | Pearson et al. | |
| 2005/0285973 A1 | 12/2005 | Singh et al. | |
| 2006/0223227 A1 | 10/2006 | Kubota et al. | |
| 2007/0045556 A1 | 3/2007 | Watanabe et al. | |
| 2007/0152148 A1 | 7/2007 | Chao et al. | |
| 2007/0183184 A1 | 8/2007 | Nakamura et al. | |
| 2007/0221859 A1 | 9/2007 | Nakata | |
| 2008/0011959 A1 | 1/2008 | Thorne | |
| 2008/0100732 A1 | 5/2008 | Minamio et al. | |
| 2008/0283764 A1 | 11/2008 | Kerwin | |
| 2009/0084971 A1 | 4/2009 | Ohta et al. | |
| 2010/0078565 A1 | 4/2010 | Tsubota et al. | |
| 2010/0224785 A1 | 9/2010 | Chiyoma et al. | |
| 2011/0133939 A1 | 6/2011 | Ranganathan et al. | |
| 2011/0272588 A1 | 11/2011 | Jadrich et al. | |
| 2012/0097857 A1 | 4/2012 | Hayatsu et al. | |
| 2014/0027637 A1 | 1/2014 | Watano | |
| 2014/0159226 A1 | 6/2014 | Bolognia | |
| 2015/0061043 A1 | 3/2015 | Bolognia | |
| 2016/0322418 A1 | 11/2016 | Leblans et al. | |
| 2017/0258422 A1 | 9/2017 | Kim et al. | |
| 2017/0307766 A1 | 10/2017 | Abenaim et al. | |

FOREIGN PATENT DOCUMENTS

| | | |
|---|---|---|
| JP | 2006-052978 | 2/2006 |
| JP | 2006-351765 | 12/2006 |
| JP | 2008-171881 | 7/2008 |
| JP | 2008-268038 | 11/2008 |
| JP | 2009-189384 | 8/2009 |
| WO | WO 2007/039840 | 4/2007 |
| WO | WO 2009/066556 | 5/2009 |

OTHER PUBLICATIONS

Cesmeli, Erdogan Ph.D., "V-Res—Detecting the Difference in Volume CT," GE Healthcare Publication.

Extended Search Report dated May 26, 2015 in European Application No. 13755853.2 filed Aug. 4, 2014 in 6 pages.

International Search Report and Written Opinion of the International Search Authority in PCT/US2013/027643, dated Jun. 24, 2013, 12 pages.

Maloney, Lawrence D., "Close Cooperation Among a Global Engineering Team Led to the Success of the Lightspeed VCT Medical Scanner," Test & Measurement World Aug. 2005.

* cited by examiner

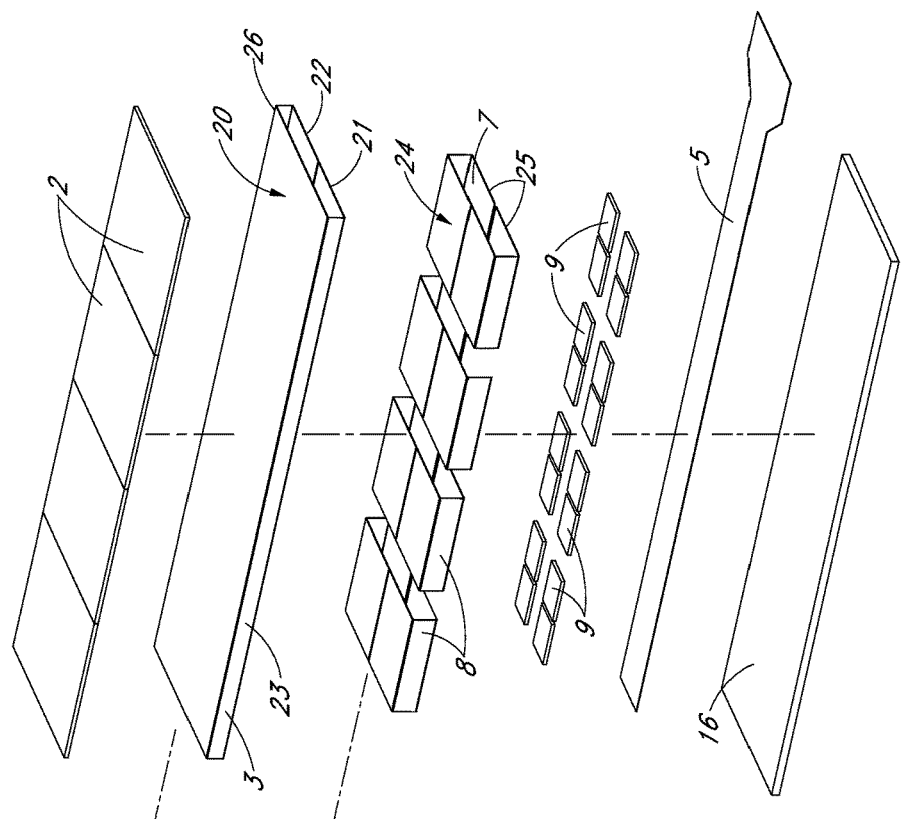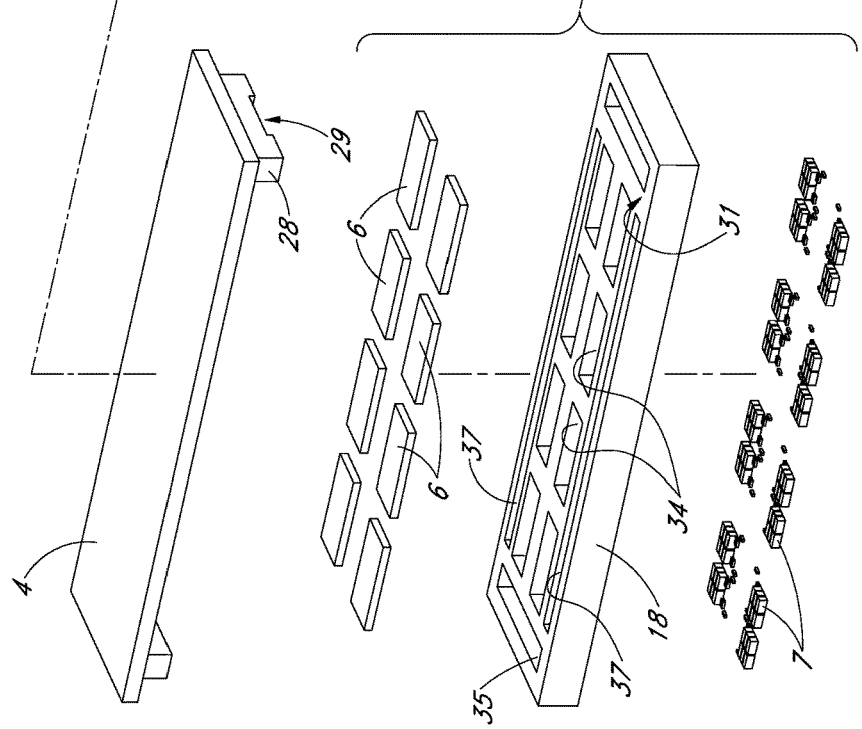
FIG. 3

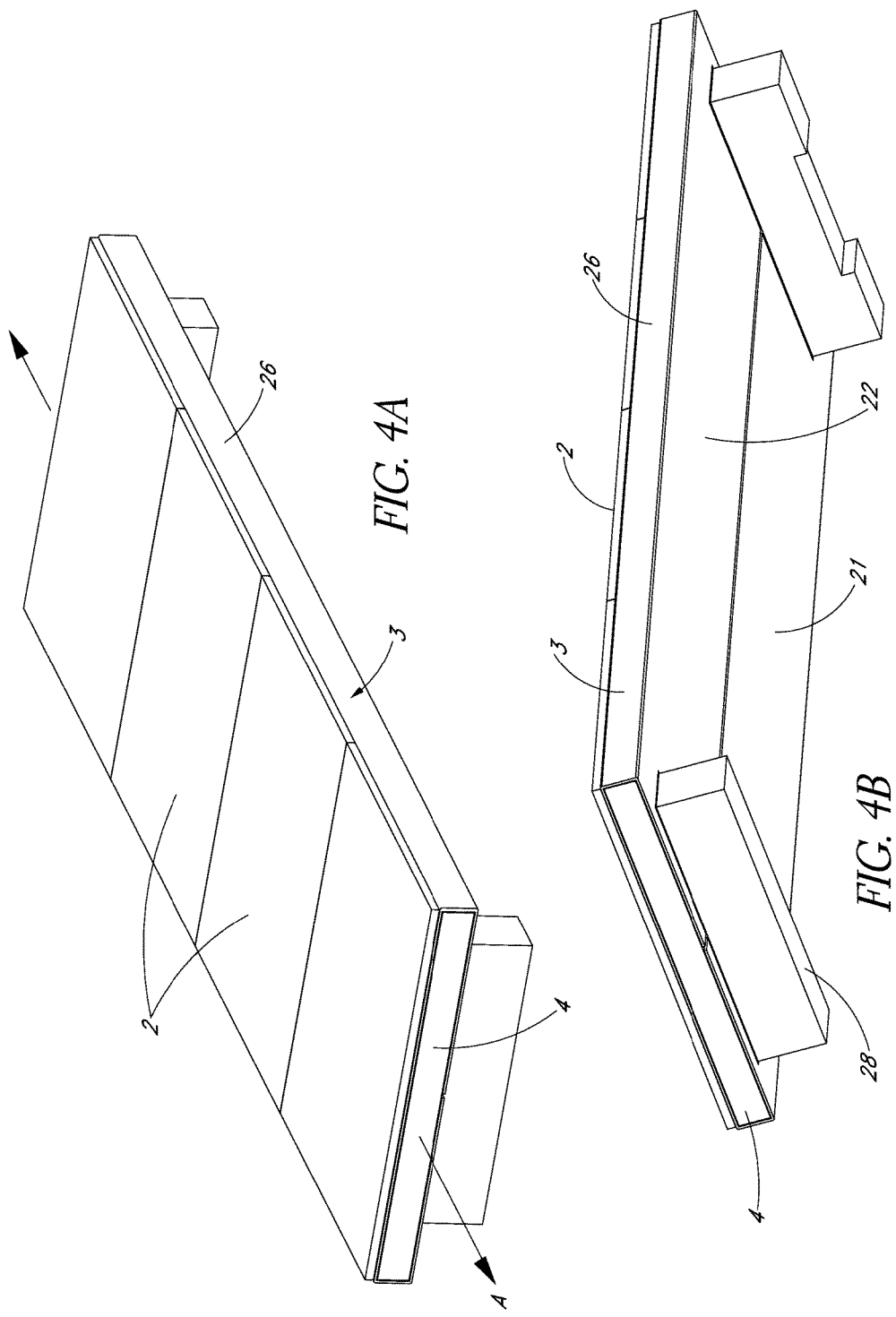

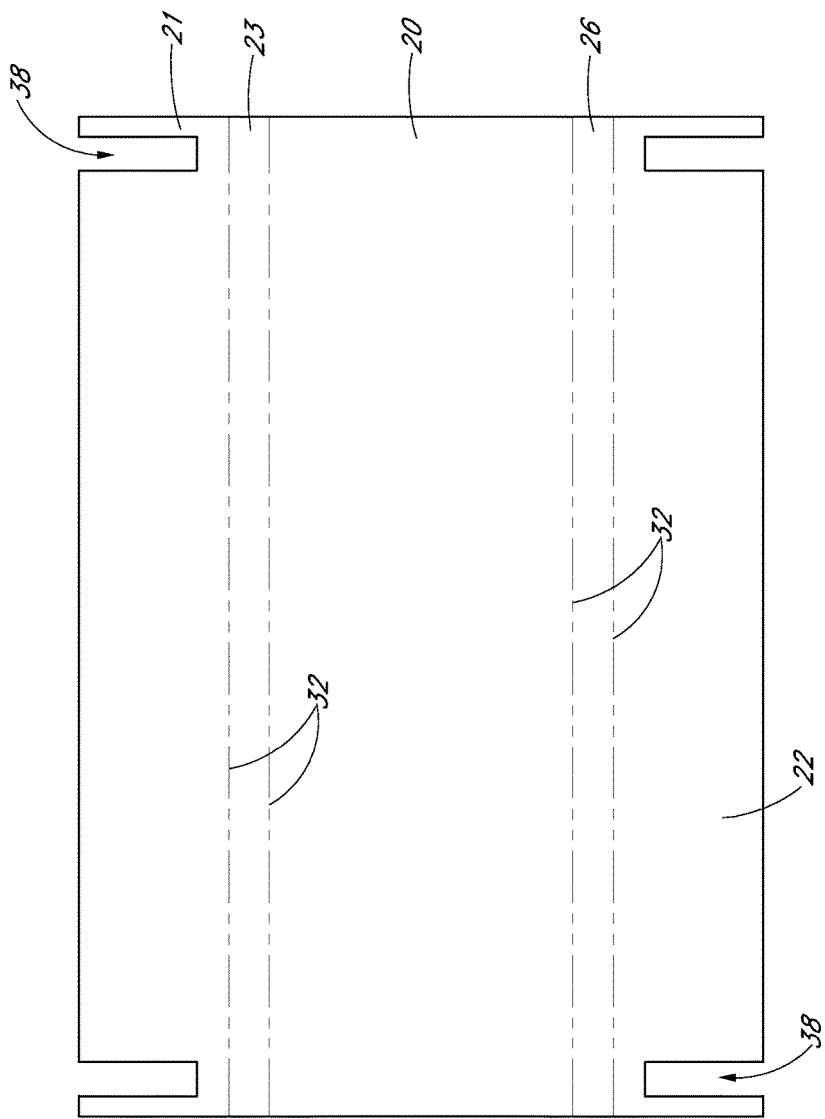

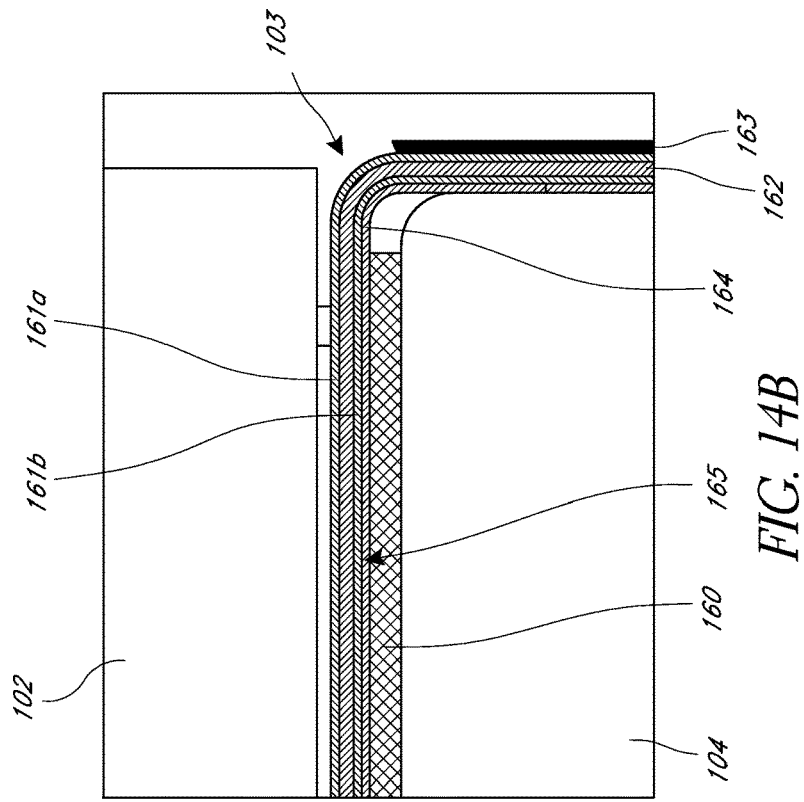
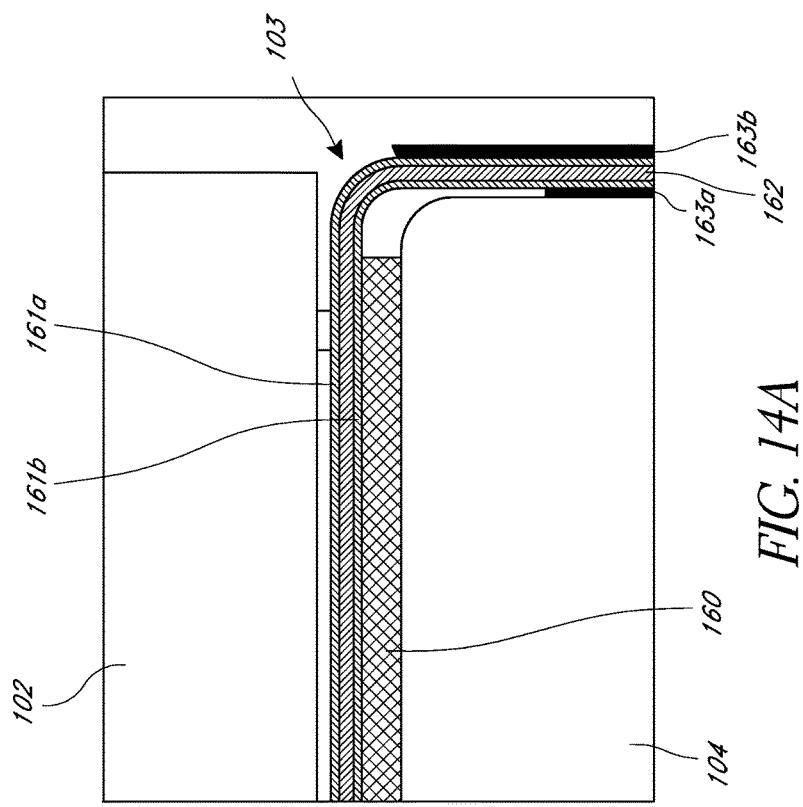

COMPACT SENSOR MODULE

CROSS-REFERENCE TO RELATED APPLICATIONS

This application is related to U.S. patent application Ser. No. 13/405,594 (now U.S. Pat. No. 8,829,454), filed Feb. 27, 2012; U.S. patent application Ser. No. 14/478,810, filed Sep. 5, 2014; and U.S. patent application Ser. No. 13/708,727, filed Dec. 7, 2012, the contents of each of which are incorporated by reference herein in their entirety and for all purposes.

BACKGROUND

Field

The present disclosure relates generally to a sensor module including a sensor and processing electronics.

Description of the Related Art

Sensor modules that include both a sensor and a processor (e.g., a general purpose processor or an Application-Specific Integrated Circuit, or ASIC) can be useful in a variety of optical, electrical, and electronic applications. In some implementations, it can be desirable to arrange the sensor module so that the sensor and processor are positioned relatively close to one another. For example, analog signals can experience parasitic losses as the signals are transmitted over a distance, which can degrade the accuracy and quality of the detected signal. Positioning the sensor near the processor can reduce or eliminate parasitic losses associated with signal transmission between the sensor and the processor. The processor can then perform various preconditioning and/or preprocessing operations, such as converting analog signals to digital signals, within the sensor module. The processor can transmit the processed digital signals to an external control module, which can be located far from the sensor, with minimal or no parasitic transmission losses to the signals.

One problem associated with positioning the processor near the sensor is that the heat generated by the processor may be transmitted to the sensor. It can be undesirable to transmit heat to the sensor for a variety of reasons. For example, the heat can cause damage due to a mismatch of the thermal coefficients among the parts. Heating the sensor can also damage sensor components or can interfere with the signals detected by the sensor. Therefore, while it can be advantageous to position the processor near the sensor to improve the quality of the signals detected and transmitted from the sensor, it is also important to prevent the sensor from overheating due to operation of the nearby processor.

Another consideration when designing sensor modules is ensuring that the sensor module (e.g., including the sensor and the processor) is compact or small enough to comply with the overall system design requirements, which can be important whether the modules are employed individually or are assembled in an array. For example, in some arrangements, an array of sensor modules is used to detect signals received in various locations or at different angles. In some applications, an array of sensor modules can be used for imaging applications, such as for x-ray detection in a computed tomography (CT) device. Arrays can include one-dimensional strings or two-dimensional (2D) arrays. CT devices can be used in a variety of applications, including medical imaging, industrial imaging, nondestructive testing, imaging subsurface minerals, and various other uses. Because the sensor modules are positioned adjacent one another in the array in some implementations, the sensor, the processor, and other components must fit within their associated area in the array. Moreover, because there are neighboring sensor modules on each side of a particular sensor module, features connecting the sensor module to the external control module should not interfere with neighboring sensor modules. In other imaging applications, sensor modules can be used to detect sound waves within an ultrasound system. In yet other implementations, sensor modules can be employed in nuclear imaging applications, such as in positron emission tomography (PET) scans and gamma ray imaging applications. In nuclear imaging applications, a sensor (or sensor array in some embodiments) can be used to image an object (e.g., a patient) that has been provided with (e.g., ingested or been injected with) a radioactive tracer material.

Accordingly, it can be advantageous to provide a compact sensor module that positions the sensor close to processing electronics while ensuring that the sensor and/or sensor substrate is sufficiently insulated from heat generated by the processing electronics.

SUMMARY

In one aspect, a sensor module for an imaging system is disclosed. The sensor module can include a sensor substrate and an imaging sensor die mounted on the sensor substrate. The imaging sensor die can comprise a plurality of pixels on a front side of the imaging sensor die. A support structure can be disposed behind the imaging sensor die, the support structure comprising a back side that faces away from the front side of the imaging sensor die. The support structure can include an alignment feature on the back side of the support structure, the alignment feature positioned at a known displacement from a reference pixel of the plurality of pixels. The alignment feature can be configured to mechanically connect to a corresponding alignment mechanism of the imaging system.

In another aspect, a method of manufacturing a sensor module for an imaging system is disclosed. The method can include providing a sensor module comprising an imaging sensor die and a support structure disposed behind the imaging sensor die. The support structure can comprise a back side that faces away from a front side of the imaging sensor die. The imaging sensor die can include a plurality of pixels on the front side of the sensor die. The method can include forming an alignment feature on the back side of the support structure, the alignment feature positioned at a known displacement from a reference pixel of the plurality of pixels. The alignment feature can be configured to mechanically connect to a corresponding alignment mechanism of the imaging system.

In yet another aspect, a method of installing a sensor module in an imaging system is disclosed. The method can include providing a sensor module comprising an imaging sensor die and a support structure, the imaging sensor die comprising a plurality of pixels on a front side of the sensor die. The method can include aligning an alignment feature on a back side of the support structure with a corresponding alignment mechanism on a bracket of the imaging system. The method can include mechanically connecting the alignment feature with the corresponding alignment mechanism.

In another aspect, a device module is disclosed. The device module can include a substrate and an integrated device die mounted on the substrate. A plurality of interconnects can electrically connect the integrated device die with the substrate. An adhesive can be disposed between the integrated device die and the substrate, the adhesive disposed around each of the interconnects. A first portion of the adhesive can be exposed along a first edge of the device module, the first portion comprising a negative fillet that does not extend beyond an outer perimeter of the integrated device die.

In another aspect, a method of manufacturing a device module is disclosed. The method can include electrically connecting an integrated device die to a substrate by way of a plurality of interconnects. The method can include wrapping the substrate around a first side of a stiffener. The method can include supplying a flowable adhesive between the integrated device die and the substrate along a first edge of the device module that is positioned along a second side of the stiffener, the second side opposite the first side of the stiffener In another aspect, a device module is disclosed. The device module can comprise a stiffener and a substrate wrapped around a side of the stiffener. The substrate can include a front side and a rear side. The substrate can comprise a dielectric buffer layer on the rear side of the substrate and one or more conductive traces on the front side of the substrate. An integrated device die can be mounted to the front side of the substrate. An adhesive can be disposed between the dielectric buffer layer and the stiffener.

In another aspect, a method of manufacturing a device module is disclosed. The method can include providing a substrate having a front side and a rear side, the substrate comprising a dielectric buffer layer on the rear side of the substrate and one or more conductive traces on the front side of the substrate. The method can further include mounting an integrated device die to the front side of the substrate. The method can comprise wrapping the substrate about a side of the stiffener such that the dielectric buffer layer faces the stiffener. The method can include contacting the dielectric buffer layer and the stiffener with an adhesive.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

FIG. 3 is a perspective, exploded view of the compact sensor module of FIG. 2.

FIGS. 4A-4B are perspective views of a stiffener, sensor dies, and sensor substrate shown in FIG. 3.

FIG. 4C is a plan view of a sensor substrate in an unfolded configuration.

FIG. 14A is an enlarged schematic side cross-sectional view of a portion of the sensor module, according to one embodiment.

FIG. 14B is an enlarged schematic side cross-sectional view of a portion of the sensor module, according to another embodiment.

DETAILED DESCRIPTION

Embodiments disclosed herein describe systems, methods, and apparatus relating to compact sensor modules having one or more sensor die(s) and processor die(s) in electrical communication with the sensor die(s). In the disclosed embodiments, the sensor die(s) may be physically positioned near an associated processor die (or multiple processor dies) to reduce parasitic losses that may occur when the signal from the sensor die(s) is transmitted to the processor die(s) for pre-processing (e.g., analog-to-digital conversion). To prevent heat generated by the processor die(s) from damaging the sensor die(s), various intervening structural members may be disposed between the sensor die(s) and the processor die. The sensor die(s), processor die(s), passive components, substrates, and structural members may be packaged in a compact manner to provide a sensor package having a low profile.

A. Examples of Sensor Modules

Figure 1:
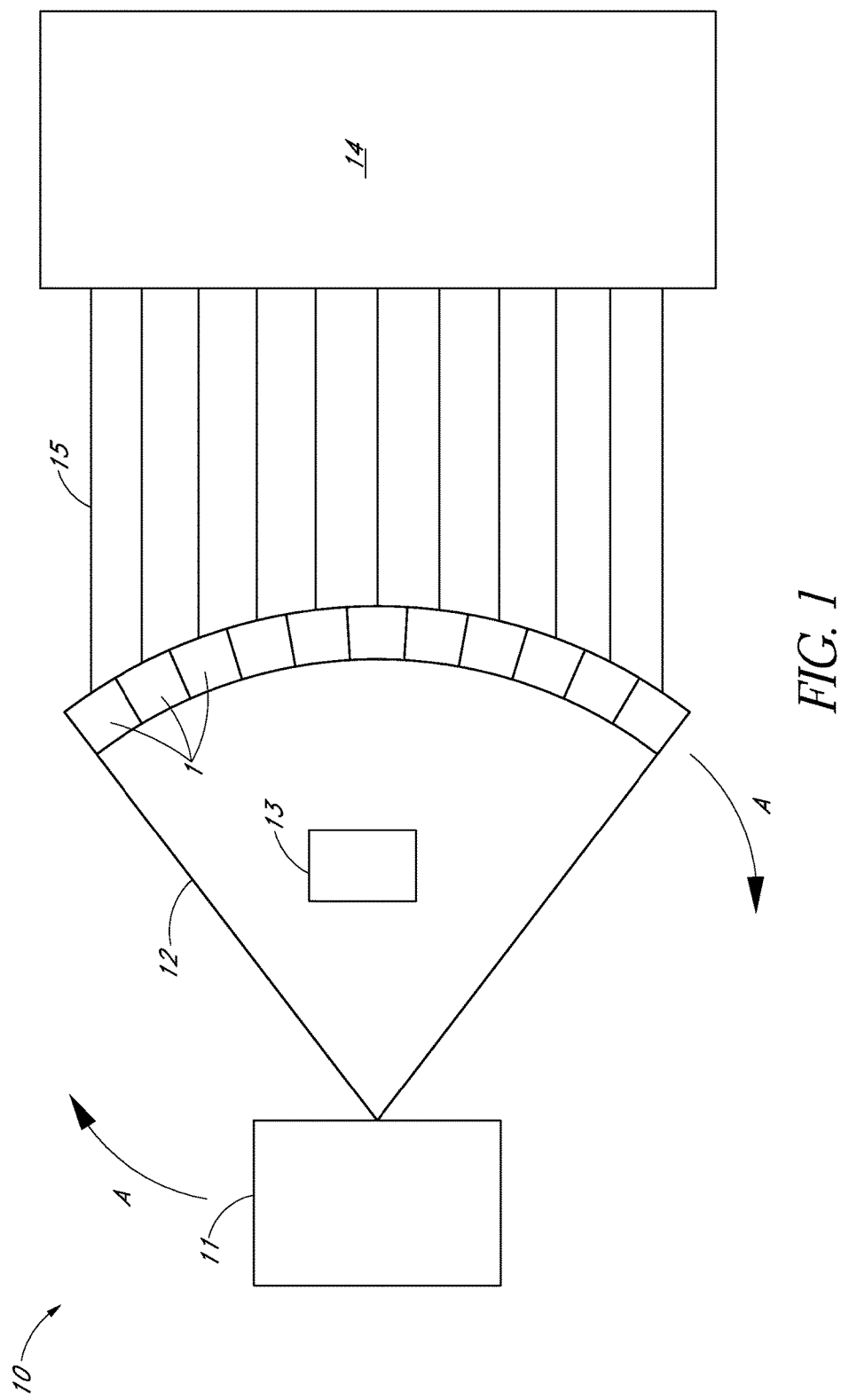
FIG. 1 is a schematic plan view of an imaging system, according to one embodiment.

FIG. 1 illustrates an imaging system 10 according to one embodiment. In some implementations, the imaging system 10 can be a computed tomography (CT) device. CT devices are useful in a variety of fields, including medical imaging, industrial imaging, nondestructive testing, and subsurface imaging. In the imaging system 10 of FIG. 1, a source 11 can emit radiation 12 in the direction of an object 13 to be imaged (e.g., a patient). In one embodiment, the source 11 emits x-ray radiation. Skilled artisans will understand that there are various conventional mechanisms to emit radiation for imaging purposes. After some portion of the radiation 12 passes through the object 13, it reaches a one-dimensional (1D) or two-dimensional (2D) array of sensor modules 1 positioned opposite the source 11. The sensor modules 1 can be configured to convert detected radiation (e.g., visible light) to electrical signals using a photodiode array (PDA), which can be the sensor of this imaging example. In some implementations, the sensor module 1 may also be configured to convert detected x-ray radiation to visible light, or the system 10 can include a separate scintillator for that purpose. In other implementations, detected x-ray radiation may be converted to electrical signals in other ways. The sensor module 1 is also configured to convert the analog signals received from the PDA into digital signals that can be transmitted by transmission elements 15 to an external control module 14. The sensor module 1 can also perform various other preprocessing and/or preconditioning operations on the detected signals before transmission to the control module 14. After the processed digital signals are received by the control module 14, the control module 14 can further process the digital signals into a readable output, such as an image on a display device or a report of various measured values calculated from the received signals. To obtain a full 3D image of the object 13, the system 10 can rotate around the object 13 in the direction A shown in FIG. 1 to obtain images of the subject 13 at various angles.

In other embodiments, the imaging system can be an ultrasound device. Although an ultrasound device is not expressly illustrated herein, it should be appreciated that an ultrasound device, according to some embodiments, can include a source of ultrasonic waves and a detector (or detector array) that includes one or more sensor modules similar to those described in more detail below. Furthermore, the sensor module(s) can be used in nuclear imaging implementations, such as PET scans and gamma ray imaging techniques. In yet other embodiments, the sensor modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, sensor modules similar to those illustrated herein may be useful in providing a compact sensor package, while thermally insulating the sensor from the processor.

Figure 2:
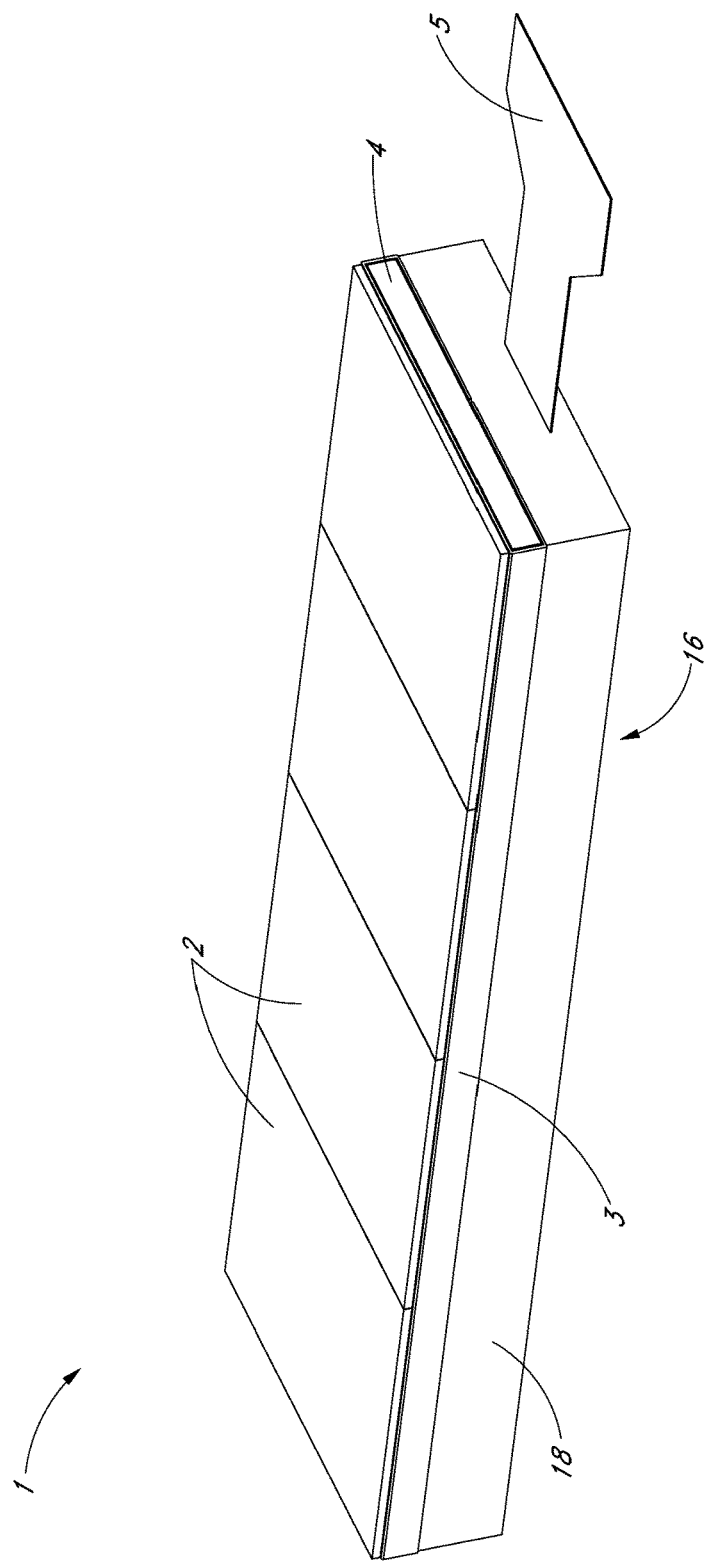
FIG. 2 is a perspective, assembled view of a compact sensor module, according to one embodiment.

Turning to FIG. 2, a perspective view of an example sensor module 1 is illustrated. The sensor module 1 can include one or more sensor dies 2 mounted on a flexible sensor substrate 3. In some embodiments, the sensor die 2 can comprise an x-ray sensing device, including, e.g., a PDA or other imaging sensor. In x-ray applications, the module may also include a collimator and a scintillator array for converting the x-rays to visible light, or the collimator and scintillator can be separately provided over the module within the imaging system. In still other embodiments, the sensor die 2 can include any other suitable device configured to detect signals, including, e.g., MEMS sensors and other electrical and electronic sensors. Note that, although the sensor module 1 illustrates four sensor dies 2, in other embodiments, it is possible to only use one, two, three, or greater than four sensor dies.

The sensor substrate 3 can be a flexible substrate with integrated bond pads, leads and traces, which allows for a low profile. The sensor substrate 3 can include multiple conductive leads configured to electrically couple to external devices or substrates. In some embodiments, the sensor die 2 can be mechanically and electrically coupled to the sensor substrate 3 by way of a gold thermocompression bond with copper leads. In other embodiments, the sensor die 2 can be soldered to the sensor substrate 3, while in yet other embodiments, the sensor die 2 can be coupled to the sensor substrate 3 using anisotropic conductive film (ACF) or non-conductive paste (NCP) technologies.

Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry, which permits contacting downstream components in a variety of configurations. Furthermore, traces and leads can be patterned on the flexible substrate in very small dimensions. For example, in some embodiments, the traces can have line widths and spaces on the order of about 15 to 20 µm, and the leads or bond pads can have widths or diameters of about 200-300 µm with similar spacing, such that the pitch is on the order of 400-600 µm. By employing small lead pitch, it is possible for the sensor substrate to electrically communicate with a large number of pixels (e.g., corresponding to portions of the PDA), which can advantageously increase the resolution of the imaging device. In one embodiment, each of the four illustrated sensor dies 2 can include 480 pixels electrically coupled to the sensor substrate 3, for a total of 1920 pixels in the 4-sensor array shown in FIG. 2. In other embodiments, each sensor die can include a fewer or a greater number of pixels, including e.g., 512 pixels per sensor die. In yet other embodiments, the line widths and spaces can be much smaller or larger, depending on the desired lead density for a particular arrangement. The dimensions of the sensor module 1 can vary according to the desired implementation. For example, in some embodiments, the illustrated four-die sensor module can have a total length in a range of about 60 mm to about 100 mm and a width in a range of about 20 mm to about 30 mm. The height or thickness of the sensor module 1 can be relatively small, e.g., in a range of about 5 mm to about 10 mm in various embodiments.

Returning to FIG. 2, the sensor substrate 3 can be mounted on or coupled to a portion of a stiffener 4. As will be discussed in more detail below, the stiffener 4 can provide structural support for the sensor module 1 and can assist in thermally separating the sensor dies 2 from the processor dies, as described herein. As shown in FIG. 2 and discussed in more detail below, the sensor substrate 3 can be wrapped around the stiffener 4. The ends of the flexible sensor substrate 3 that are wrapped around the stiffener 4 may electrically couple to a flexible processor substrate, as illustrated and described with respect to, e.g., FIGS. 3 and 5. The stiffener 4 can be made of any suitable material, such as a metal, e.g., aluminum. In other arrangements, the stiffener 4 can be made of a plastic or ceramic.

The stiffener 4 and the sensor substrate 3 can couple to a carrier 18 configured to support the sensor module 1. As explained below, the carrier 18 can also support a radiation shield, and the flexible processor substrate(s) described herein can be folded about the carrier 18. Further, a connector 5 can extend through an opening in the stiffener 4. As explained below, the connector 5 can electrically couple the processor substrate(s) to the external controller 14, which may be positioned away from the sensor module 1. The connector 5 may also be made of a flexible material, such as a pigtail connector, and can include embedded metallic traces and conductive contacts configured to electrically connect to the processor substrate(s) described below. The sensor module 1 can also include a heat spreader coupled to a bottom side of the carrier 18, as described with respect to FIG. 3 below. The heat spreader can be formed of a thermally conductive material, such as a metal, to conduct heat from the processors in a direction away from the sensor dies.

FIG. 3 is a perspective, exploded view of the compact sensor module of FIG. 2. As mentioned above, the sensor module 1 can include one or more sensor dies 2 and the flexible sensor substrate 3. The flexible sensor substrate 3 is illustrated in a folded configuration, such that the sensor substrate 3 includes a mounting segment 20, a first wing segment 21, a second wing segment 22, a first side segment 23 between the mounting segment 20 and the first wing segment 21, and a second side segment 26 between the mounting segment 20 and the second wing segment 22. The first and second wing segments 21, 22 of the sensor substrate 3 may be bent or folded around edges of the stiffener 4. Also, as shown, the stiffener 4 can include a plurality of walls 28 extending from a base portion of the stiffener 4. At least one of the walls 28 can include an opening 29 sized and shaped to allow the connector 5 to pass therethrough.

The sensor module 1 can also include one or more flexible processor substrates 8, shown in a folded condition in FIG. 3, and one or more processor dies 9 to be mounted on and electrically coupled to the flexible processor substrate(s) 8. In FIG. 3, two processor substrates 8 are positioned below each sensor die 2, for a total of eight flexible processor substrates 8 for the illustrated four-sensor die module. It should be appreciated, however, that only one processor substrate 8 may be positioned below each sensor die 2 in some arrangements; in other embodiments, more than two processor substrates 8 may be positioned below each sensor die 2; and as noted above, the module 1 can have greater or fewer than four sensor dies. As will be described in more detail below, each flexible processor substrate 8 can include a first mounting segment 24 folded over a first side 31 of the carrier 18 and a second mounting segment 25 folded over a second side of the carrier. As explained below, the first and/or second mounting segments 24, 25 of the processor substrate 8 can be inserted through slots 37 formed through the carrier 18.

The carrier 18 can include a top side 31 and a bottom side 33 (see FIG. 7B) opposite the top side 31. Apertures 35 may be formed near end regions of the carrier 18. As shown in FIG. 3, the apertures may be sized and shaped to receive the walls 28 of the stiffener 4. In addition, two slots 37 may be formed through the entire thickness of the carrier 18. The slots 37 may be sized such that the flexible processor substrate 8 can be fed through the slots 37 and folded around the carrier 18. Further, a plurality of shield recesses 34 may be formed in the top side 31 of the carrier 18. The shield recesses 34 can extend partly through the thickness of the carrier 18 and can be sized and shaped to receive radiation shields 6. The radiation shields 6 may be provided to block radiation from impinging upon the processor die(s) 9 and damaging its components. In various arrangements the radiation shields 6 may be positioned within and coupled to the shield recesses 34 of the carrier 18 using an adhesive; in other arrangements, no adhesive may be used. One or more passive electronic components 7 (such as capacitors, resistors, inductors, etc.) can be coupled to the flexible processor substrate 8. As explained below with respect to FIG. 7B, the passive components 7 may be mounted to the processor substrate 8 and can be positioned within recesses formed in the bottom side 33 of the carrier 18.

Thus, for the illustrated embodiments, after assembly, the sensor substrate 3, the stiffener 4, the carrier 5, the processor substrate(s) 8, and the radiation shield 6 intervene between the processor die(s) 9 and the sensor die(s) 2, although not all these features will intervene in other embodiments. As explained herein, by folding the flexible processor substrate(s) 8 over the carrier 18, the processor die(s) 9 may be spaced apart from the sensor substrate 3 while still making electrical contact to the sensor substrate 3. The intervening carrier 18 and stiffener 4 can thereby act to thermally separate the processor die(s) 9 from the sensor die(s) 2 to prevent heat generated by the processor die(s) 9 from being transmitted to the sensor die(s) 2 and potentially damaging the sensor die(s) 2. To provide electrical communication between the sensor die(s) 2 and the processor die(s) 9, the first and second wing segments 21 and 22 of the sensor substrate 3 can electrically connect to the first mounting segment(s) 24 of the flexible processor substrate(s) 8. The electrical bonds between the processor substrate(s) 8 and the processor die(s) 9 can complete the electrical pathway between the sensor die(s) 2 and the processor die(s) 9. In various implementations, the flexible sensor substrate 3 (e.g., the first and second wing segments 21, 22) can be soldered to the first mounting segment(s) 24 of the flexible processor substrate(s) 8. In other embodiments, the flexible sensor substrate 3 can be electrically coupled to the processor substrate(s) 8 using ACF or NCP technologies. As with the sensor die(s) 2, the processor die(s) 8 may be electrically coupled to the processor substrate(s) 8 using a gold thermocompression bond with copper leads; in other arrangements, solder may be used, or ACF or NCP techniques may be used.

The heat spreader 16 can be coupled to the carrier 18, and the connector 5 can electrically connect to the flexible processor substrate 8 and/or other components by way of the opening 29 within the stiffener 4. The opening 29 can be a through hole formed in the wall 28 of the stiffener 4. The connector 5 can extend along the length of the sensor module 1 and can electrically connect to all the processor substrates 8, e.g., to the second mounting segments 25 of the eight illustrated processor substrates 8. While FIG. 3 illustrates one example implementation of the sensor module 1, it should be appreciated that the particular ordering of components may vary in other implementations.

FIGS. 4A-4B are perspective views of the stiffener 4 shown in FIG. 3, with the flexible sensor substrate 3 wrapped around the stiffener 4 and including the sensor dies 2. FIG. 4C is a plan view of the sensor substrate 3 in an unfolded configuration. In FIG. 4C, dotted lines 32 are shown to illustrate the position of creases when the sensor substrate 3 may be folded about the stiffener 4 of FIGS. 4A-4B. The stiffener 4 can include the walls 28 extending from a base portion. As shown in FIG. 4C, the sensor substrate 3 can include wall openings 38 sized and shaped to allow the walls 28 to extend through the openings 38 when the sensor substrate 3 is folded or wrapped around the stiffener 4. In other embodiments, however, the stiffener 4 may not include walls. In yet other embodiments, the sensor substrate 3 may be short enough to wrap around the stiffener 4 in a space between the two walls 28 such that there may be no wall openings in the sensor substrate 3.

As seen in FIG. 3, the walls 28 can be configured to extend through apertures 35 in the carrier 18. A distal end portion of the walls 28 can be configured to contact the heat spreader 16 when the module 1 is assembled. The walls 28 can thereby provide a relatively solid or rigid connection between the stiffener 4 and the heat spreader 16 in the assembled module 1. In some arrangements, the walls 28 can be attached to the heat spreader using an adhesive to couple the stiffener 4 to the heat spreader 16 (shown in FIG. 3).

As shown in FIGS. 4A-4B, the flexible sensor substrate 3 can be wrapped around the stiffener 4 where creases are parallel to a longitudinal axis A of the sensor module 1. The four sensor dies 2 can be mounted adjacent one another in a direction substantially parallel to the longitudinal axis A. Advantageously, the sensor substrate 3 may include more electrical contacts in the longitudinal axis A than in its width or transverse direction (e.g., a direction perpendicular to the longitudinal axis A). By wrapping the sensor substrate 3 about the longitudinal axis A, therefore, the sensor module 1 can take advantage of the dense electrical contacts of the sensor substrate 3. In various embodiments, for example, the sensor substrate 3 can include over a thousand electrical contacts per side in the longitudinal axis A. The increased number of contacts can enable the sensor substrate 3 to receive data from a large number of pixels of the sensor dies 2. For example, in the disclosed embodiment, each sensor die 2 can include 480 pixels (or 512 pixels in other arrangements), and each pixel can include a channel, e.g., an electrical pathway, to a corresponding electrical contact on the sensor substrate 3. The dense contacts of the sensor substrate 3 can thereby enable the integration of processing signals from high resolution sensor dies 2.

Figure 5:
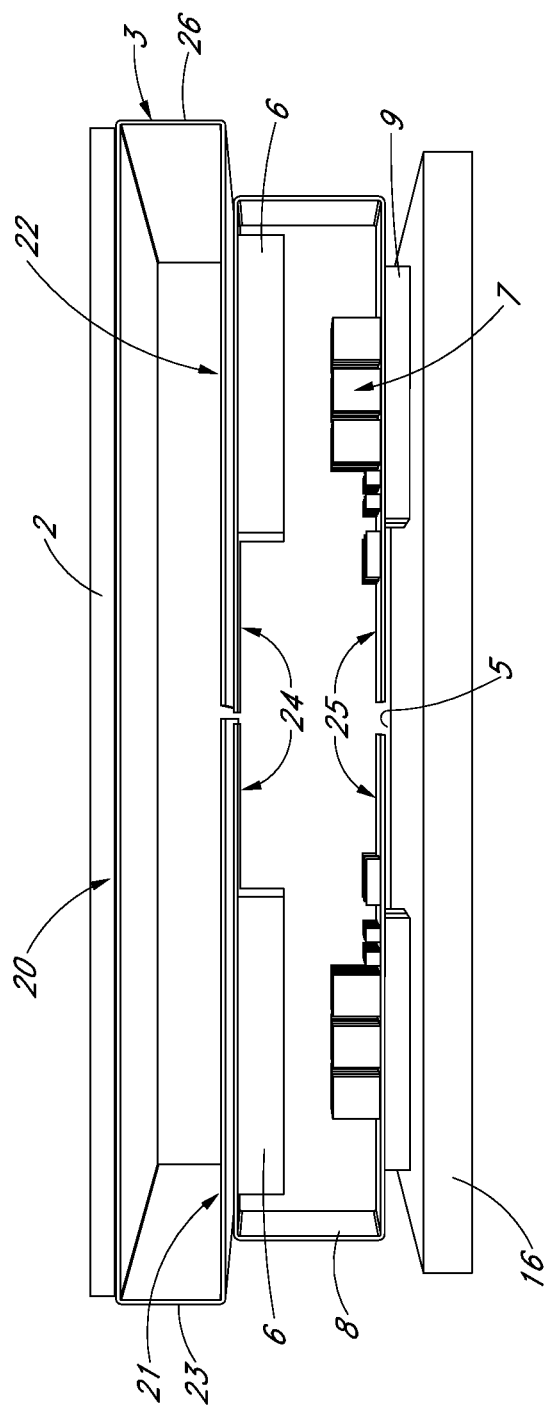
FIG. 5 is a side view of various internal components of the compact sensor module shown in FIG. 2 with the stiffener omitted for purposes of illustration.
Figure 6A:
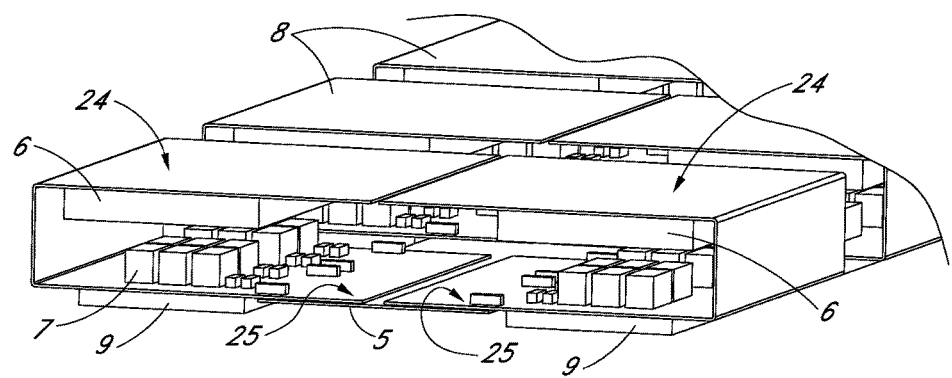
FIGS. 6A-6B are perspective views of internal components of the compact sensor module, including multiple flexible processor substrates, radiation shields, processor dies, and passive electronic components.
Figure 6B:
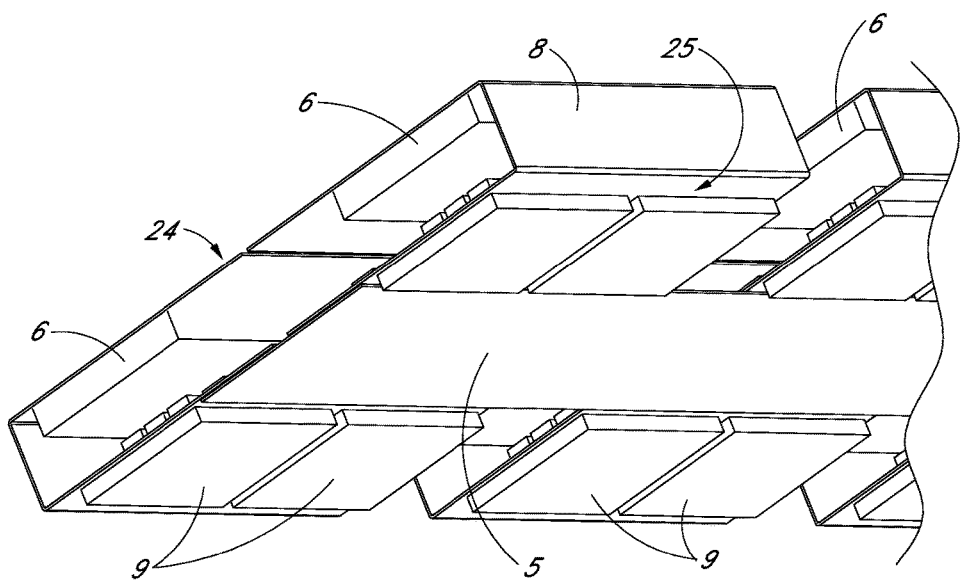

FIG. 5 is a side view of various internal components of the compact sensor module shown in FIG. 2. FIGS. 6A-6B are perspective views of the internal components of the compact sensor module, including multiple flexible processor substrates, radiation shields, processor dies, and passive electronic components. The carrier 18 and the stiffener 4 are not shown in FIG. 5 for purposes of illustration. Likewise, the carrier 18, the stiffener 4, the sensor substrate 3, and the sensor dies 2 are not illustrated in FIGS. 6A-6B for purposes of illustration.

As shown in FIG. 5, the first and second wing segments 21 and 22 of the flexible sensor substrate 3 can be coupled to the first mounting segments 24 of the illustrated processor substrates 8. As explained above, solder, or other electrically conductive adhesives, can electrically connect electrical contacts on the sensor substrate 3 with corresponding electrical contacts on the processor substrate 8. Internal traces of the sensor substrate 3 can provide electrical communication between the electrical contacts coupled to the sensor dies 2 and the electrical contacts coupled to the flexible processor substrate(s) 8.

As explained above, the first mounting segment 24 of the processor substrate 8 can be folded around a first side of the carrier 18, and the second mounting segment 25 can be folded around a second side of the carrier 18 (FIG. 3). The mounting segments 24, 25 may be inserted through the slots 37 of the carrier 18. As shown in FIGS. 5 and 6A-6B, the first and second mounting segments 24 and 25 may be folded in substantially the same direction as the sensor substrate 3, e.g., around the longitudinal axis A illustrated in FIGS. 4A-4B. Further, the processor substrates 8 associated with a particular sensor die 2 may be positioned adjacent one another in a direction transverse to the longitudinal axis A, e.g., transverse to the direction about which the processor substrates 8 are folded.

Internal traces within the processor substrates 8 can route signals from the sensor dies 2 to the processor dies 9 that are mounted on the second mounting segments 25 of the flexible processor substrates 8. Thus, analog signals detected by the sensor dies 2 can be transmitted to the mounting segment 20 of the sensor substrate 3 and through internal traces of the sensor substrate 3 to the first and second wing segments 21 and 22 of the flexible sensor substrate 3. The signals can then be transmitted to the first mounting segments 24 of the flexible processor substrates 8 and through internal traces of the flexible processor substrates 8 to the second mounting segments 25, where the signals are transmitted to the processor dies 9. Furthermore, one or more passive electronic components 7 may also be coupled to the second mounting segments 25 of the flexible processor substrates 8. The passive components 7 can include, e.g., capacitors and resistors for conditioning signals, such as to smooth the analog signals transmitted from the sensor dies 2.

As shown in FIG. 6A-6B, each flexible processor substrate 8 can be coupled to two processor dies 9. Since there are two processor substrates 8 positioned under and associated with each sensor die 2 in the embodiment of FIGS. 2 and 3, there are four processor dies 9 in electrical communication with the sensor die 2 in FIGS. 6A-6B. However, it should be appreciated that there may be fewer processor dies 9 associated with each sensor die 2, such as one, two, or three processor dies 9 in electrical communication with the sensor die 2. In other embodiments, there may be more than four processor dies 9 in communication with each sensor die 2.

Furthermore, the connector 5 (FIGS. 2 and 3) can extend along the longitudinal axis A of the sensor module 1. The connector 5 can electrically couple to the second mounting segments 25 of adjacent flexible processor substrates 8. In one embodiment, the second mounting segments 25 of the processor substrates 8 may be coupled to the connector 5 using ACF bonding technologies. In other embodiments, NCP, solder, or other conductive adhesives may be used to electrically connect the connector 5 to the flexible processor substrates 9. The connector 5 can extend outwardly through the aperture 29 of the carrier 18 (FIG. 3). The connector 5 can electrically connect to an external system, such as, e.g., the controller 14 (FIG. 1), to transmit the digital signals processed by the processor 9 to the controller 14.

Figure 7A:
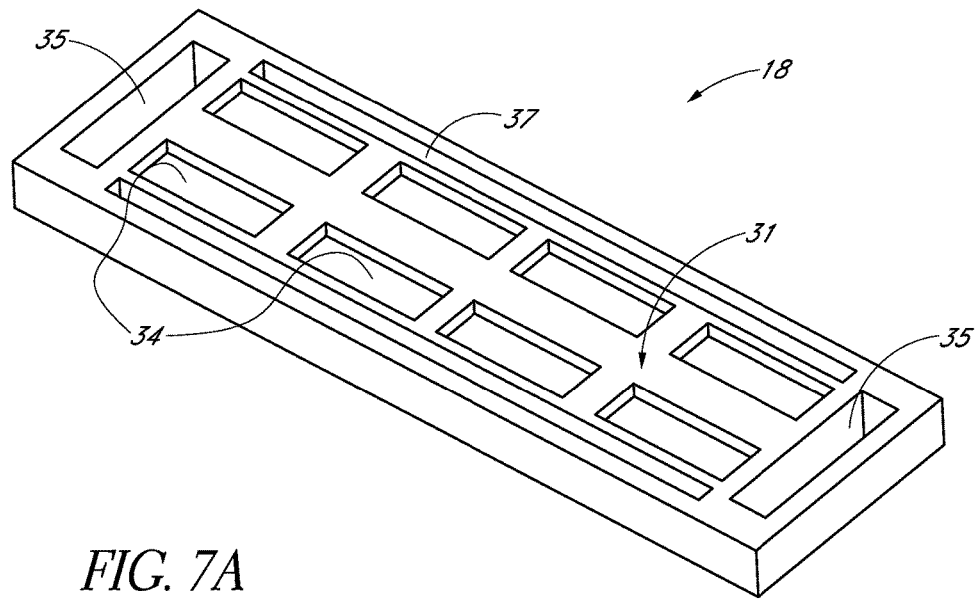
FIG. 7A is a perspective view of a top side of the carrier shown in FIG. 3.
Figure 7B:
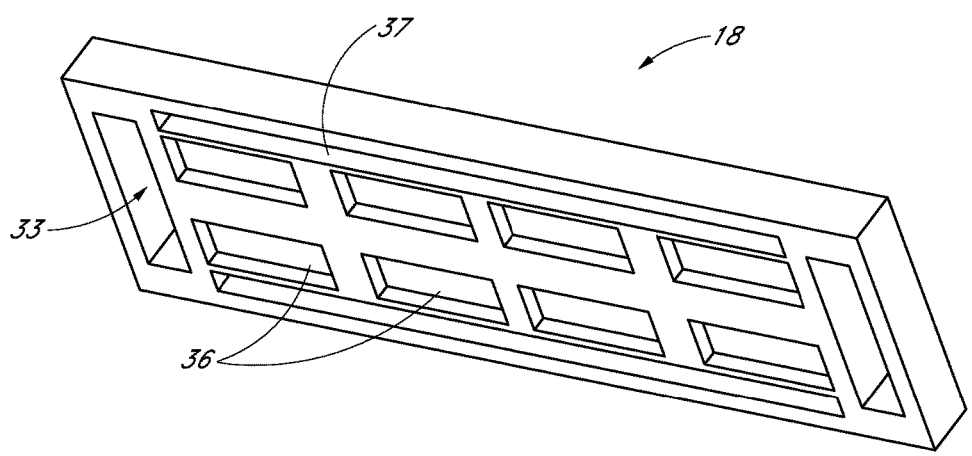
FIG. 7B is a perspective view of a bottom side of the carrier shown in FIG. 7A.

FIG. 7A is a perspective view of a top side 31 of the carrier 18 shown in FIG. 3, and FIG. 7B is a perspective view of a bottom side 33 of the carrier 18 shown in FIG. 7A. As explained above with respect to FIG. 3, the carrier 18 may include apertures 35 that are shaped to receive the walls 28 of the stiffener 4. The walls 28 of the stiffener 4 may therefore pass through the apertures 35 to couple to the heat spreader 16. One of the walls 28 can include the opening 29, and the connector 5 may extend through the opening 29 of the wall 28. Further, the carrier 18 can include two slots 37 sized and shaped such that portions of the flexible processor substrates 8 may pass through the slots 37 so that the mounting segments 24 and 25 of the processor substrates 8 may be folded over the top and bottom sides 31 and 33 of the carrier 18.

The carrier 18 may also include one or more shield recesses 34 in the top side 31 of the carrier 18. The shields 6 (FIGS. 5, 6A, and 6B) may be coupled to and positioned within the shield recesses 34 such that the first mounting segment 24 of the flexible processor substrate 8 may be folded over the top side 31 of the carrier without interference from the shields 6. Similarly, one or more component recesses 36 may be formed in the bottom side 33 of the carrier 18. The component recesses 36 may be sized and shaped to accommodate the passive electronic components 7 that are mounted to the second mounting segment 25 of the flexible processor substrates 8. In other embodiments, it should be appreciated that the shields 6 may be mounted within the recesses 36 on the bottom side 33 of the carrier 18, while the passive electronic components 7 may be mounted to the first mounting segment 24 of the flexible processor substrates 8 and positioned within the recesses 34 formed in the first side 31 of the carrier 18.

B. Additional Examples of Sensor Modules

FIGS. 8-14B illustrate various configurations of an improved sensor module 101 according to some embodiments. The embodiments shown in FIGS. 8-14B may include features that improve manufacturability and/or performance relative to the sensor modules 1 described above. Unless otherwise noted, reference numerals for the components of the sensor module 101 shown in FIGS. 8-14B may represent components that are similar to or the same as those designated by the reference numerals used in connection with the sensor module 1 of FIGS. 1-7B, with the reference numerals incremented by 100 relative to the components of FIGS. 1-7B. Furthermore, unless otherwise noted, the features disclosed herein in connection with the sensor module 101 of FIGS. 8-14B may be used in the sensor module 1 shown in FIGS. 1-7B.

Figure 8:
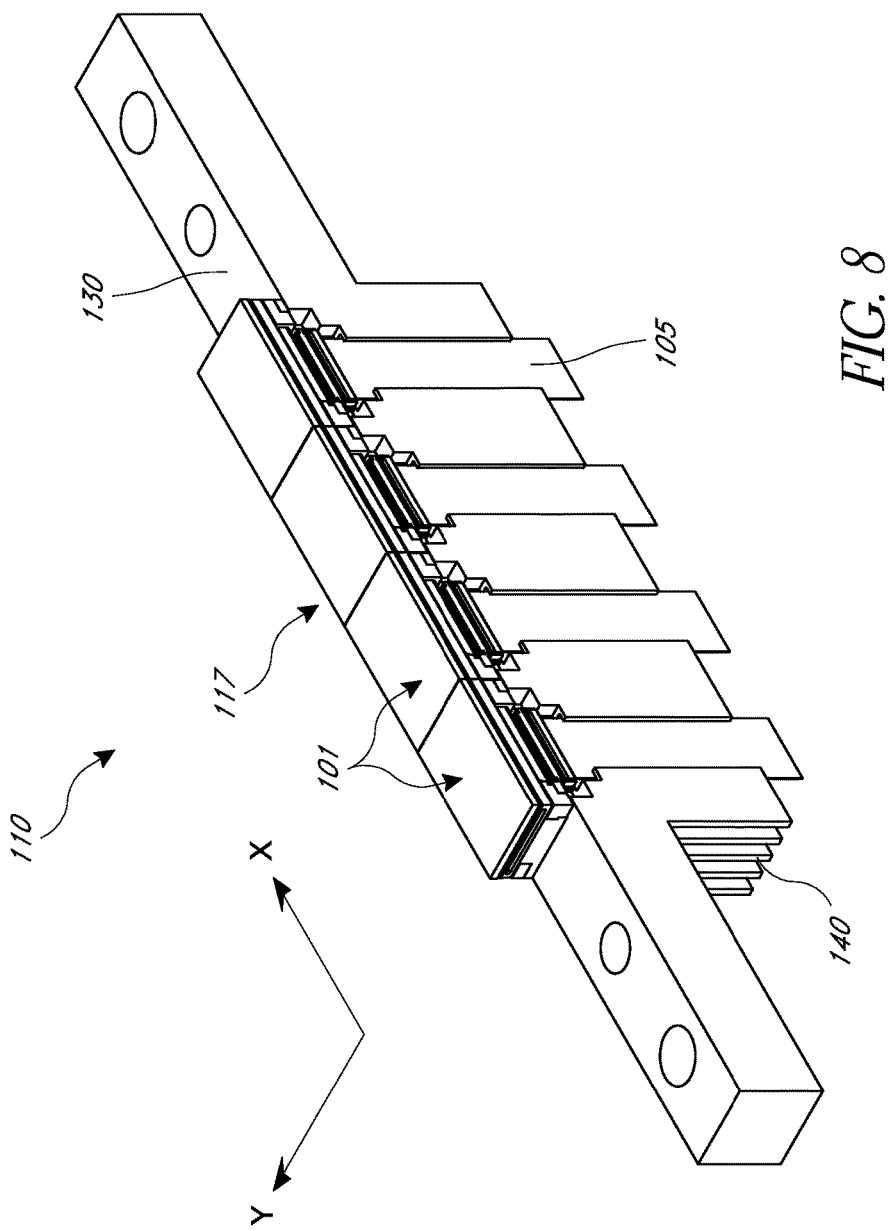
FIG. 8 is a three-dimensional schematic perspective view of a portion of an array of sensor modules, in accordance with an embodiment.

FIG. 8 is a three-dimensional schematic perspective view of a portion of an array of sensor modules 101. As shown in FIG. 8, each sensor module 101 can be mounted on a bracket 130 that is part of a larger imaging system 110. The imaging system 110 may be the same as or similar to the imaging system 10 described above with respect to FIG. 1. For example, the imaging system may comprise a CT device, an X-ray device, an ultrasound device, etc. In the example of FIG. 8, four sensor modules 101 are positioned in a string 117 that extends along a longitudinal X-axis, however, it should be appreciated that more or fewer than four modules 101 can be positioned in the string 117 adjacent one another along the X-axis. Although not illustrated in FIG. 8, the array of modules 101 can comprise multiple strings 117 adjacent one another along a direction which is transverse to the X-axis. In some embodiments, the strings 117 can be positioned along a curved surface, each string 117 representing one of the modules 1 of FIG. 1. As shown in FIG. 8, for example, the Y-axis of the illustrated string 117 can be tangent to the curved surface along which the array of modules 101 is positioned. In various arrangements, a patient can be positioned inside the curved surface of the array, and the system 110 can image portions of the patient's body.

As shown in FIG. 8, the sensor modules 101 can be mounted on a front side of the bracket 130 and one or more heat sinks 140 can be disposed on a back side of the bracket 130. Each heat sink 140 can comprise fins or other heat transfer elements that can effectively dissipate heat generated by the modules 101 into the atmosphere. In some embodiments, a fan can direct air over the heat sink 140 to improve heat dissipation from the modules 101; in other embodiments, the heat sink 140 can be exposed to ambient air without the use of a fan. In addition, as shown in FIG. 8, a connector substrate 105 can extend downwardly from each module 101 to connect to an external control module, which may be the same as or similar to the control module 14 described above in connection with FIG. 1. Furthermore, as shown in Figure, it can be important to space adjacent modules 101 apart along the bracket 130 by a small gap so that adjacent modules 101 do not touch one another.

Figure 9A:
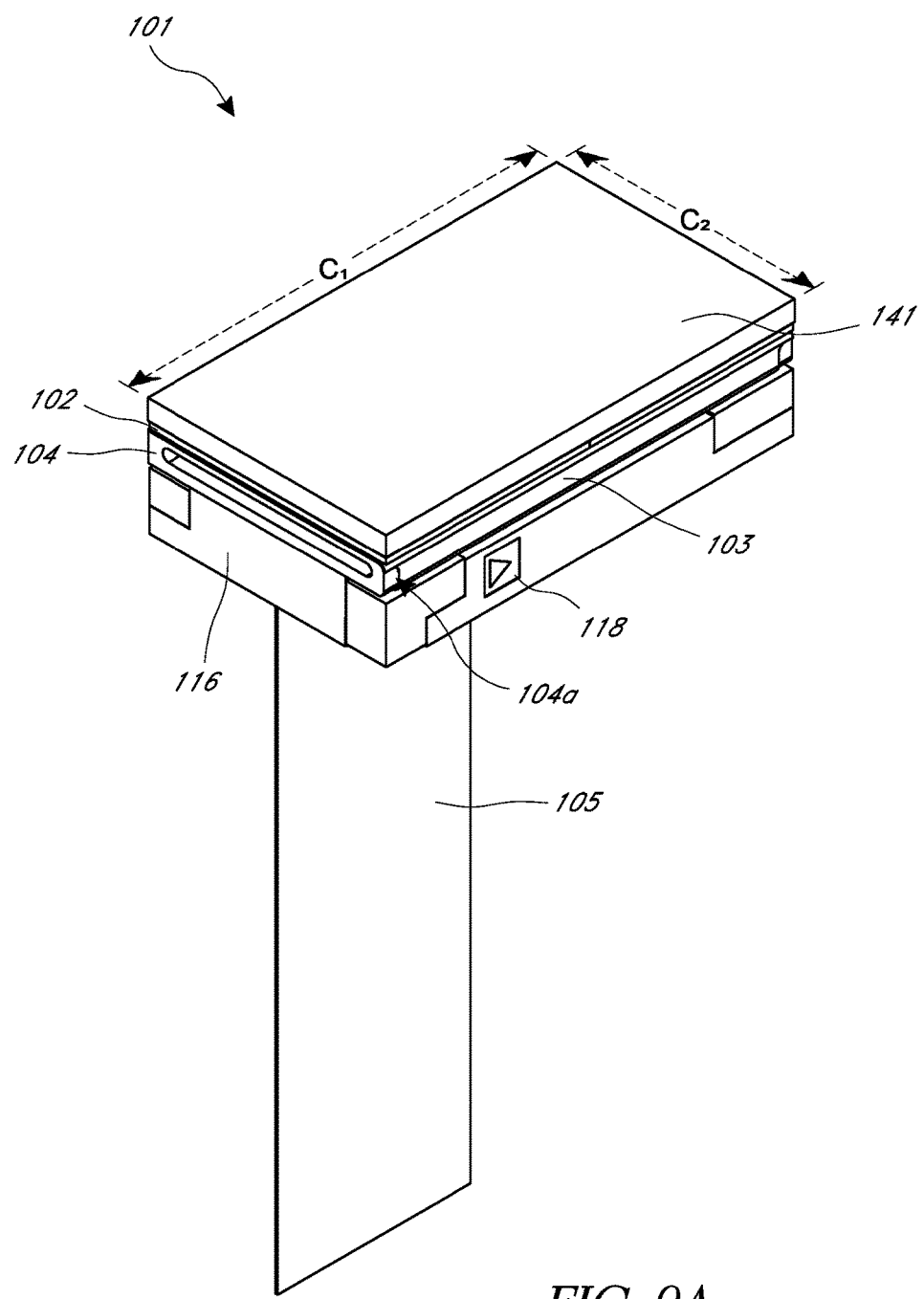
FIG. 9A is a three-dimensional schematic top perspective view of one the sensor modules shown in FIG. 8.
Figure 9B:
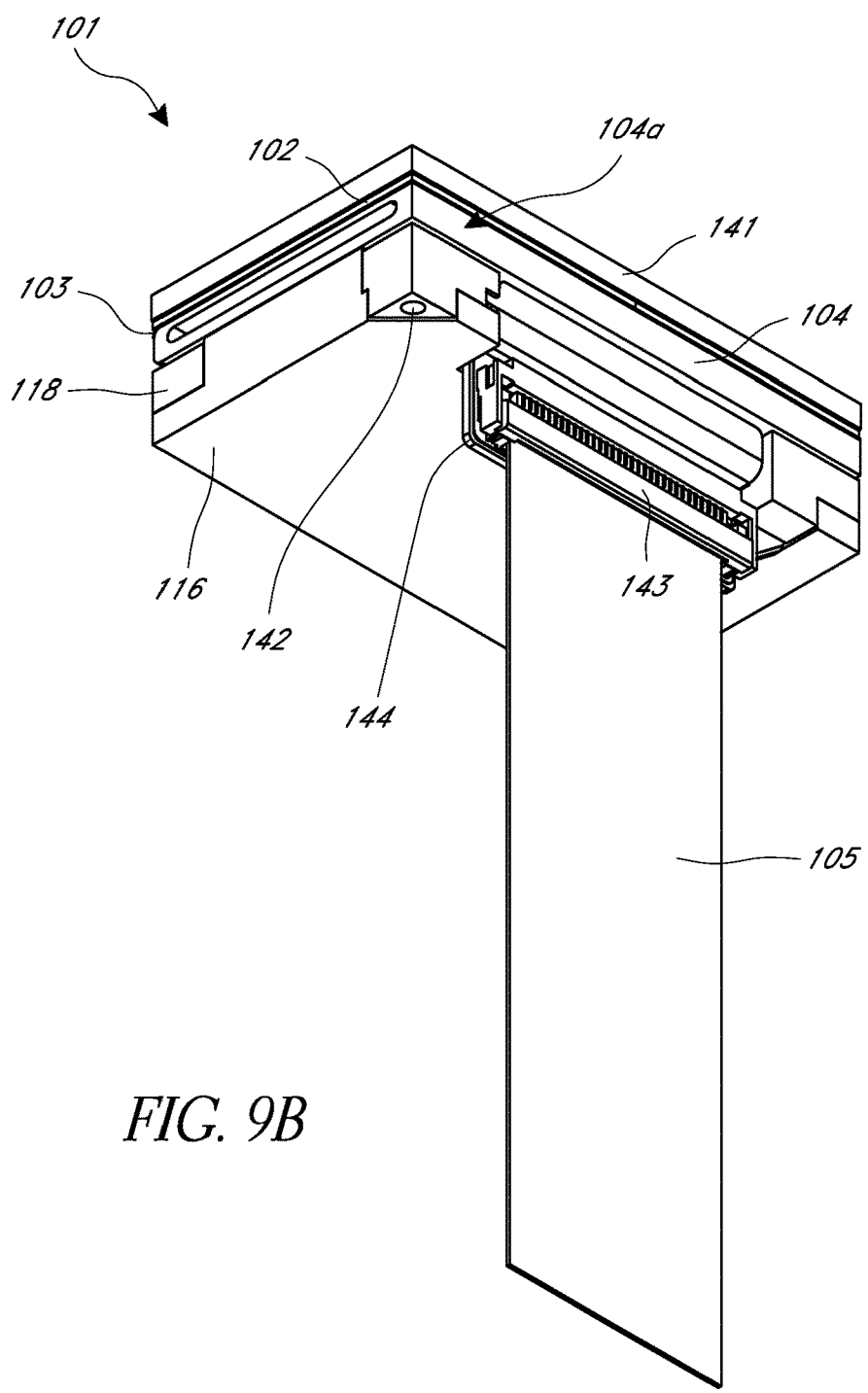
FIG. 9B is a three-dimensional schematic bottom perspective view of the sensor module shown in FIG. 9A.

FIG. 9A is a three-dimensional schematic top perspective view of the sensor module 101 shown in FIG. 8. FIG. 9B is a three-dimensional schematic bottom perspective view of the sensor module 101 shown in FIG. 9A. The sensor module 101 can include one or more sensor dies 102 mounted on a flexible sensor substrate 103. While referred to for convenience as a "flexible" substrate 103, it will be understood that in the course of assembly, including adhesion of the substrate 103 to other parts, the substrate may be rendered inflexible. In some embodiments, the sensor die 102 can comprise an x-ray sensing device, including, e.g., a photodiode array (PDA) or other imaging sensor. As shown in FIG. 9A, in x-ray applications, the module 101 may also include a collimator (not shown) and a scintillator 141 for converting the x-rays to visible light. The converted visible light can then be received by the sensor die 102, which can convert the visible light to an electrical signal. Alternatively, the collimator and scintillator can be separately provided over the module within the imaging system. In still other embodiments, the sensor die can include any other suitable device configured to detect signals, including, e.g., MEMS sensors and other electrical and electronic sensors. In the embodiment of FIGS. 9A-9B, the sensor module 101 includes two sensor dies 102, but in other embodiments, it is possible to only use one, three, four, or greater than four sensor dies.

Returning to FIGS. 9A-9B, the sensor substrate 103 can be mounted on or coupled to a portion of a stiffener 104. As will be discussed in more detail below, the stiffener 104 can provide structural support for the sensor module 101 and can assist in thermally separating the sensor dies 102 from the processor dies, as described herein. As shown in FIGS. 9A and 9B and as discussed in more detail below, the sensor substrate 103 can be wrapped around the stiffener 104. For example, a bottom segment 103a (FIGS. 10A-10B) of the sensor substrate 103 can be folded or wrapped around a first lateral side 104a of the stiffener 104. In the illustrated embodiment, the bottom segment 103a is not folded or wrapped around an opposite second lateral side 104b of the stiffener 104. The end of the flexible sensor substrate 103 that is wrapped around the stiffener 104 may electrically couple to a flexible processor substrate, as illustrated and described with respect to, e.g., FIGS. 10A-11A. The stiffener 104 can be made of any suitable material, such as a metal, e.g., zinc or aluminum. In other arrangements, the stiffener 104 can be made of a plastic or ceramic.

The stiffener 104 and the sensor substrate 103 can be disposed over a carrier 118 which is configured to support the processor substrate(s) (see FIGS. 10A-11A). As explained below, the flexible processor substrate(s) described herein can be folded about the carrier 118 (FIGS. 10A-11A). In addition, as shown in FIG. 9B, one or more alignment features, shown in the form of alignment holes 142 can be disposed through a bottom surface of the carrier 118. As explained herein, the alignment holes 142 (which may comprise a through hole or a recess) can advantageously assist in aligning the sensor module 101 with the bracket 130. The sensor module 101 can also include a heat spreader 116 disposed below a bottom side of the carrier 118. As shown in FIG. 11B, the heat spreader 116 can be mechanically coupled to the stiffener 104. The heat spreader 116 can be formed of a thermally conductive material, such as a metal, to conduct heat from the processors in a direction away from the sensor dies 102.

Further, a connector 143 and a connector substrate 105 can extend from the outer surface of the sensor module 101. The connector 143 and connector substrate 105 can electrically couple the processor substrate(s) (see FIGS. 10A-11A and attendant description) to the external controller (such as the controller 14 of FIG. 1), which may be positioned away from the sensor module 101. The connector substrate 105 may also be made of a flexible material, such as a pigtail connector, and can include embedded metallic traces and conductive contacts configured to electrically connect to the processor substrate(s) described below. The connector substrate 105 can be mounted on a connector plate 144. The connector plate 144 can advantageously help to stiffen the interconnection between the processor substrate(s) and the connector substrate 105, improving reliability of the electrical connections. Furthermore, the connector plate 144 (which may comprise a metal, such as a stainless steel) may act as a shield between conductors carrying analog and digital signals.

Advantageously, as explained in further detail below, the sensor module 101 shown in FIGS. 9A-9B can facilitate the use of a variable channel count, e.g., a variable number of pixels that can provide image data from the sensor die 102. For example, the sensor module 101 can include $c_1$ channels along the module's length and $c_2$ channels along the module's width. The number of channels $c_1$ and $c_2$ may vary according to the system designer's preferences, as explained in detail below with respect to FIGS. 10A-10B. For example, in some arrangements, $c_1$ can comprise 32 channels and $c_2$ can comprise 16 channels, for a total of 512 channels. In other arrangements, $c_1$ can comprise 32 channels and $c_2$ can comprise 20 channels, for a total of 640 channels. In still other arrangements, $c_1$ can comprise 32 channels and $c_2$ can comprise 24 channels, for a total of 768 channels. Thus, the sensor module 101 disclosed herein can advantageously enable the use of different channel counts with the same sensor module design.

Figure 10A:
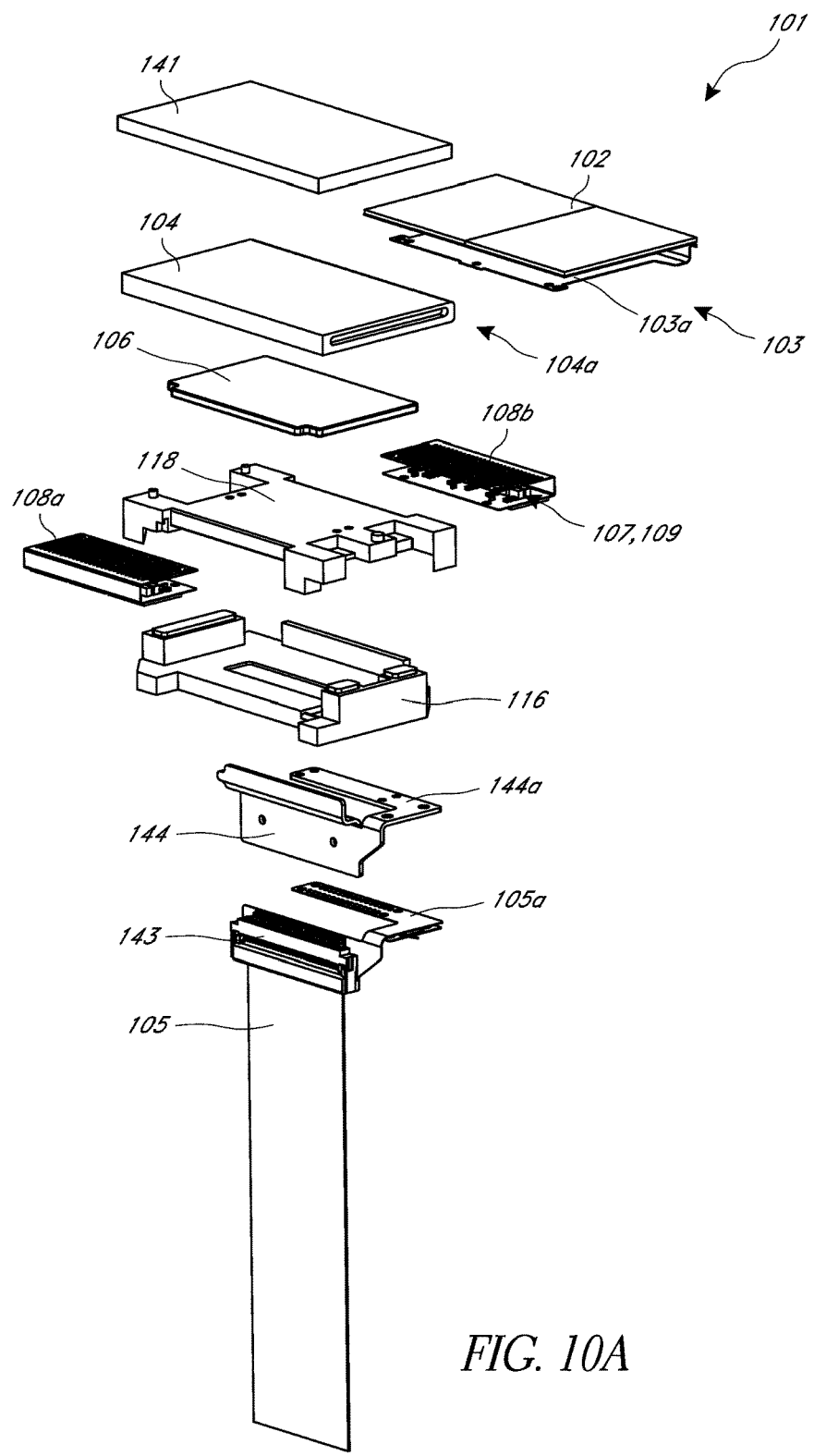
FIG. 10A is a schematic, top perspective exploded view of the sensor module shown in FIGS. 9A-9B.
Figure 10B:
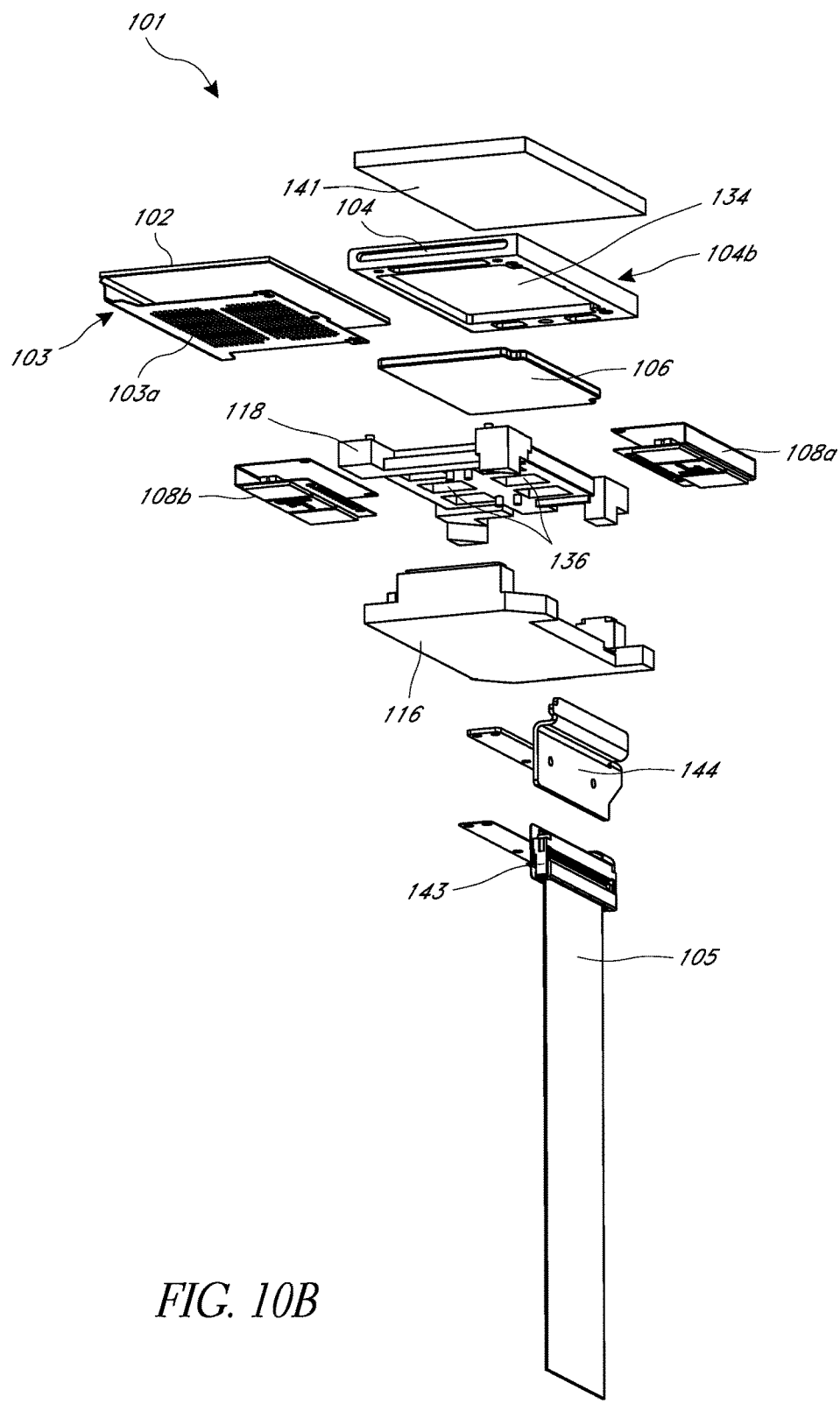
FIG. 10B is a schematic, bottom perspective exploded view of the sensor module shown in FIG. 10A.
Figure 11A:
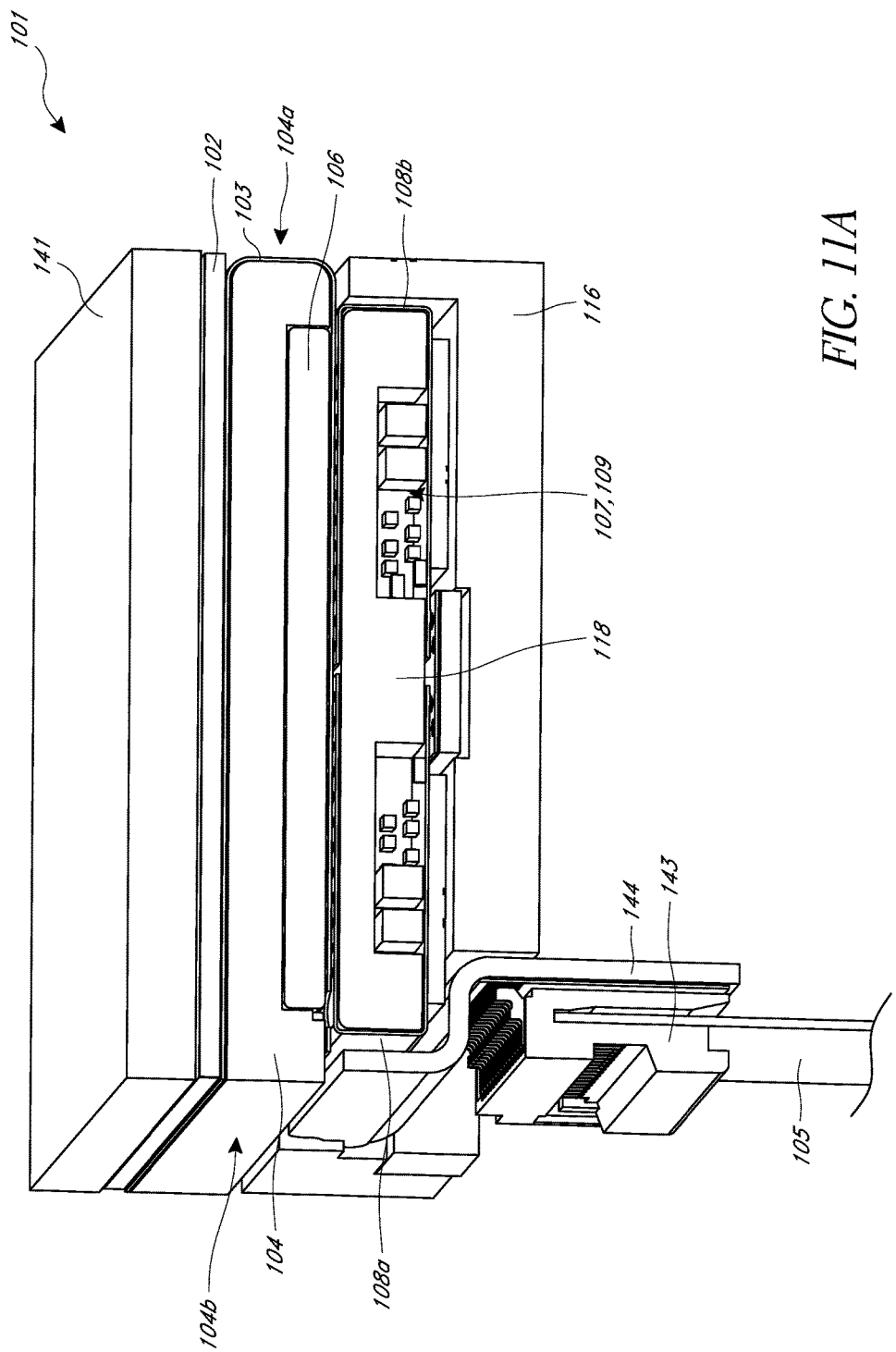
FIG. 11A is a schematic perspective cut-away view of the sensor module shown in FIGS. 10A-10B.

FIG. 10A is a schematic, top perspective exploded view of the sensor module 101 shown in FIGS. 9A-9B. FIG. 10B is a schematic, bottom perspective exploded view of the sensor module 101 shown in FIG. 10A. FIG. 11A is a schematic side cross-section of the sensor module 101 shown in FIGS. 10A-10B. In FIGS. 10A-10B, the sensor substrate 103 can comprise a flexible substrate with integrated bond pads, leads and traces, which allows for a low profile. The sensor substrate 103 can include multiple conductive leads configured to electrically couple to external devices or substrates. In some embodiments, the sensor die 102 can be mechanically and electrically coupled to the sensor substrate 103 by way of a gold thermocompression bond with copper leads. In other embodiments, the sensor die 102 can be soldered to the sensor substrate 103, while in yet other embodiments, the sensor die 102 can be coupled to the sensor substrate 103 using anisotropic conductive film (ACF) or non-conductive paste (NCP) technologies. In some arrangements, the sensor die 103 can be "flip chip" mounted to the substrate 103. As explained above, the bottom segment 103a of the substrate 103 can be folded around the first side 104a of the stiffener 104.

As explained above, flexible substrates can be useful in arrangements where it is desirable for the substrate to conform to a particular geometry employed within a system. Flexible substrates can be made of a flexible plastic material, such as polyimide or polyether ether ketone (PEEK) and can include integrated contacts, traces and leads similar to those used in conventional PCB substrate technologies. The flexible substrate can be easily bent or folded to conform to a particular geometry, which permits contacting downstream components in a variety of configurations. Furthermore, traces and leads can be patterned on the flexible substrate in very small dimensions. For example, in some embodiments, the traces can have line widths and spaces on the order of about 15 to 20 µm, and the leads or contacts can have widths or diameters of about 200-300 µm with similar spacing, such that the pitch is on the order of 400-600 µm. By employing small lead pitch, it is possible for the sensor substrate to electrically communicate with a large number of pixels (e.g., corresponding to portions of the PDA), which can advantageously increase the resolution of the imaging device. The dimensions of the sensor module 101 can vary according to the desired implementation. For example, in some embodiments, the illustrated sensor module 101 can have a total length in a range of 20 mm to 50 mm (or, more particularly, in a range of 30 mm to 40 mm) and a width in a range of 10 mm to 30 mm (or, more particularly, in a range of 15 mm to 25 mm). The height or thickness of the sensor module 101 as measured from the top surface of the sensor die 102 to the bottom surface of a heat spreader 116 can be relatively small, e.g., in a range of about 5 mm to about 10 mm in various embodiments. Despite the compact size, the assembly accomplishes both electrical shielding and heat dissipation.

As shown in FIG. 10B, a shield recess 134 can be formed through a bottom surface of the stiffener 104. One or more shields 106 can be disposed in the shield recess 134. When the bottom segment 103a of the sensor substrate 103 is folded or wrapped about the stiffener 104, the shield 106 can be secured within the shield recess 134. The radiation shield 106 may be provided to block radiation from impinging upon the processor die(s) and damaging its components. In various arrangements the radiation shields 106 may be positioned within and coupled to the shield recesses 134 of the stiffener 104 and/or the carrier 118 using an adhesive; in other arrangements, no adhesive may be used.

A first processor substrate 108a and a second processor substrate 108b may be wrapped about opposing sides of the carrier 118. The processor substrates 108a, 108b may be wrapped about axes that are generally parallel to the axis about which the sensor substrate 103 is wrapped. As with the embodiment of FIGS. 1-7B, one or more processor dies 109 and passive electronic components 107 can be mounted on and electrically coupled to the flexible processor substrates 108a, 108b. The processor dies 109 can conduct various processing operations on the signals transmitted from the sensor dies 102, e.g., converting the analog signals to digital signals.

As with the embodiment of FIGS. 1-7B, after assembly, the sensor substrate 103, the stiffener 104, the carrier 105, the processor substrate(s) 108a, 108b, and the radiation shield 106 intervene between the processor die(s) 109 and the sensor die(s) 102, although not all these features will intervene in other embodiments. As explained herein, by folding the processor substrate(s) 108 over the carrier 118, the processor die(s) 109 may be spaced apart from the sensor substrate 103 while still making electrical contact to the sensor substrate 103. The intervening carrier 118 and stiffener 104 can thereby act to thermally separate the processor die(s) 109 from the sensor die(s) 102 to prevent heat generated by the processor die(s) 109 from being transmitted to the sensor die(s) 102 and potentially damaging the sensor die(s) 102. To provide electrical communication between the sensor die(s) 102 and the processor die(s) 109, the bottom segment 103a of the sensor substrate 103 can electrically connect to the processor substrate(s) 108a, 108b. The electrical bonds between the processor substrates 108a, 108b and the processor die(s) 109 can complete the electrical pathway between the sensor die(s) 102 and the processor die(s) 109. In various implementations, the sensor substrate 103 can be soldered to processor substrates 108a, 108b. In other embodiments, the sensor substrate 103 can be electrically coupled to the processor substrates 108a, 108b using ACF or NCP technologies. As with the sensor die(s) 2, the processor die(s) 109 may be electrically coupled to the processor substrates 108a, 108b using a gold thermocompression bond with copper leads; in other arrangements, solder may be used, or ACF or NCP techniques may be used. In some embodiments, the processor die(s) 109 can be flip chip mounted to the substrates 108a, 108b.

As explained above, the sensor module 101 shown in FIGS. 10A-11A may enable the use of a variable channel count. For example, the processor substrates 108a, 108b may be wrapped about the carrier 118 in different ways which can enable the use of different numbers of processor dies 109. As one example, if a particular processor die 109 supports 128 channels, then four processor dies 109 can be used for a module 101 with 512 channels, five processor dies 109 can be used for a module 101 with 640 channels, six processor dies 109 can be used for a module 101 with 768 channels, etc. As another example, different types of sensor dies (e.g., dies with a particular pixel count) can be used to enable a variable channel count. Furthermore, in some embodiments, sensor substrates with different conductor routing patterns can be used, and/or the sensor substrates can be wrapped or folded in other ways to enable a variable channel count. Advantageously, therefore, the sensor module 101 disclosed herein can enable the use of multiple channel counts within the same module footprint. Thus, even though a first end user may desire 640 channels and a second end user may desire 768 channels, the same basic structure for the sensor module 101 may be used for both customers, except for the use of a different number of processor dies 109. Such a modular arrangement reduces system re-tooling costs associated with designing different sensor modules for devices with different channel counts.

Returning to FIGS. 10A-11A, the connector plate 144 and connector substrate 105 can be bent so as to be positioned between the processor substrates 108a, 108b and the heat spreader 116. For example, a plate arm 144a of the connector plate 144 and a substrate arm 105a of the connector substrate 105 may be shaped to extend beneath the processor substrates 108a, 108b. The processor substrates 108a, 108b can electrically connect to the connector substrate 105 through the substrate arm 105a to provide electrical communication between the processor dies 109 and the external controller (such as the controller 14 of FIG. 1). As explained above, the connector plate 144 can be used to stiffen the connector substrate 105, which can facilitate connection of the connector substrate 105 to the external controller. Further, the plate 144 can act as a shield between analog and digital signals. Advantageously, the connector 143 (which can be soldered onto connector substrate 105) can be configured to connect to any of many standard electrical interfaces, which enables the end user to easily install the sensor module 101. Furthermore, the use of the connector 143 can allow the end user to utilize any suitable length of cable to connect the connector 143 to the system board of the external controller.

Figure 11B:
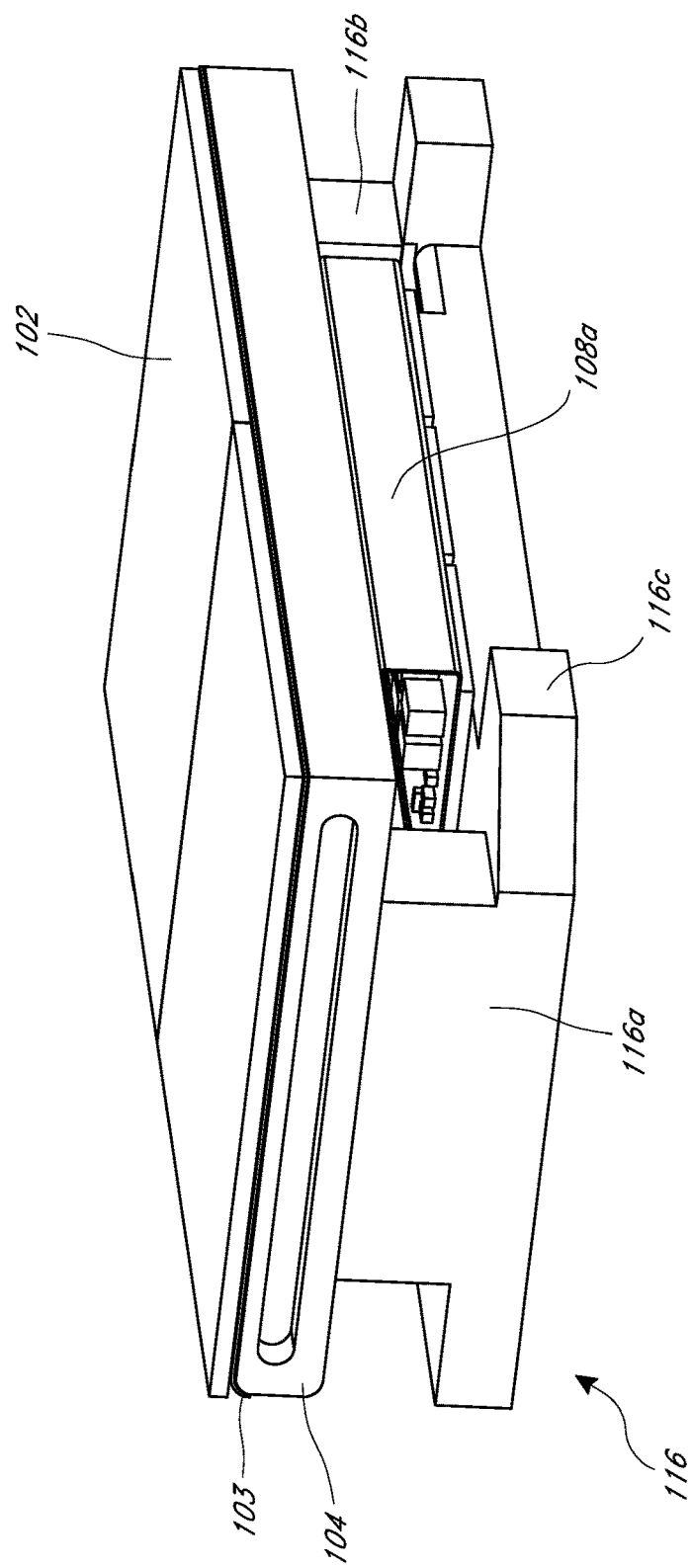
FIG. 11B is a schematic perspective view of a stiffener and heat spreader of the module of FIGS. 10A-11A.

FIG. 11B is a schematic perspective view of the stiffener 104 and heat spreader 116, according to the embodiment of FIGS. 10A-11A, with the carrier 118 omitted for ease of illustration. As shown in FIG. 11B, the heat spreader 116 can comprise a base portion 116c and first and second walls 116a, 116b that extend transversely from the base portion 116c. The first and second walls 116a, 116b can be secured to the bottom surface of the stiffener 104, e.g., using an adhesive. In other embodiments, such as that shown in FIGS. 4A-4B, the stiffener 104 can comprise legs that extend from the stiffener 104 and that attach to the heat spreader 116, with the carrier 118 (not shown in FIG. 11B) intervening. In the embodiment of FIGS. 10A-11B, the carrier 118 (not shown in FIG. 11B for ease of illustration) may not be adhered or otherwise directly mechanically connected to the stiffener 104 or heat spreader 116. In some situations, the carrier 118 (which may comprise a plastic) may be deformed during manufacturing, assembly, or use. If the carrier 118 were to instead be directly mechanically connected to the heat spreader 116, then such deformation may cause the sensor surfaces of the sensor dies 102 to be misaligned relative to (e.g., not parallel to) the heat spreader 116, which can reduce the measurement accuracy of the sensor module 101 for integration into the larger system. Moreover, by attaching the heat spreader 116 to the stiffener 104, unwanted vibrations may be reduced or eliminated. Thus, by allowing the carrier 118 to be unconnected (or "floating") relative to the heat spreader 116 and/or stiffener 104, the orientation of the sensor dies 102 may be aligned relative to the heat spreader 116 and vibrations may be reduced.

Figure 12A:
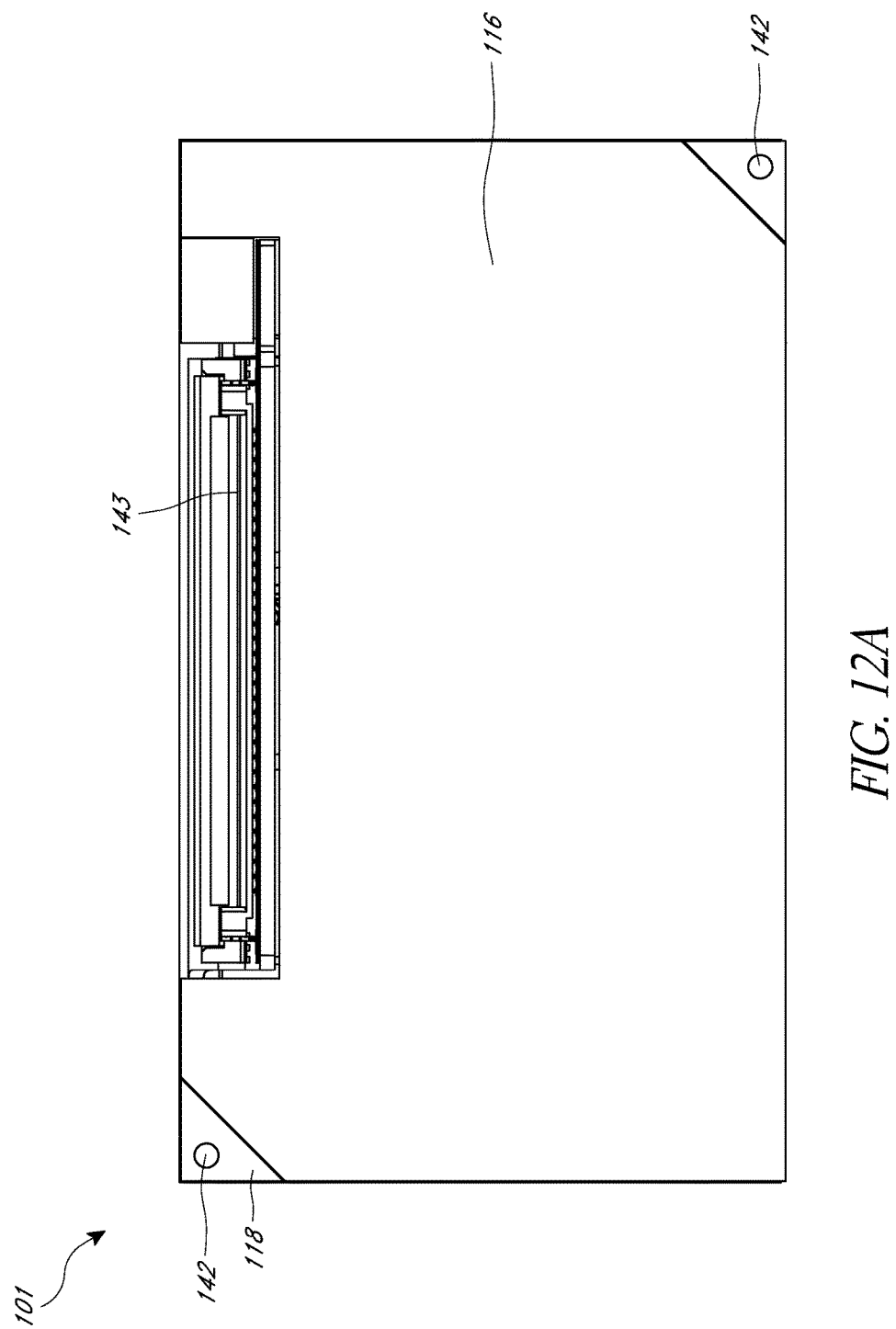
FIG. 12A is a bottom plan view of the sensor module, according to some embodiments.
Figure 12B:
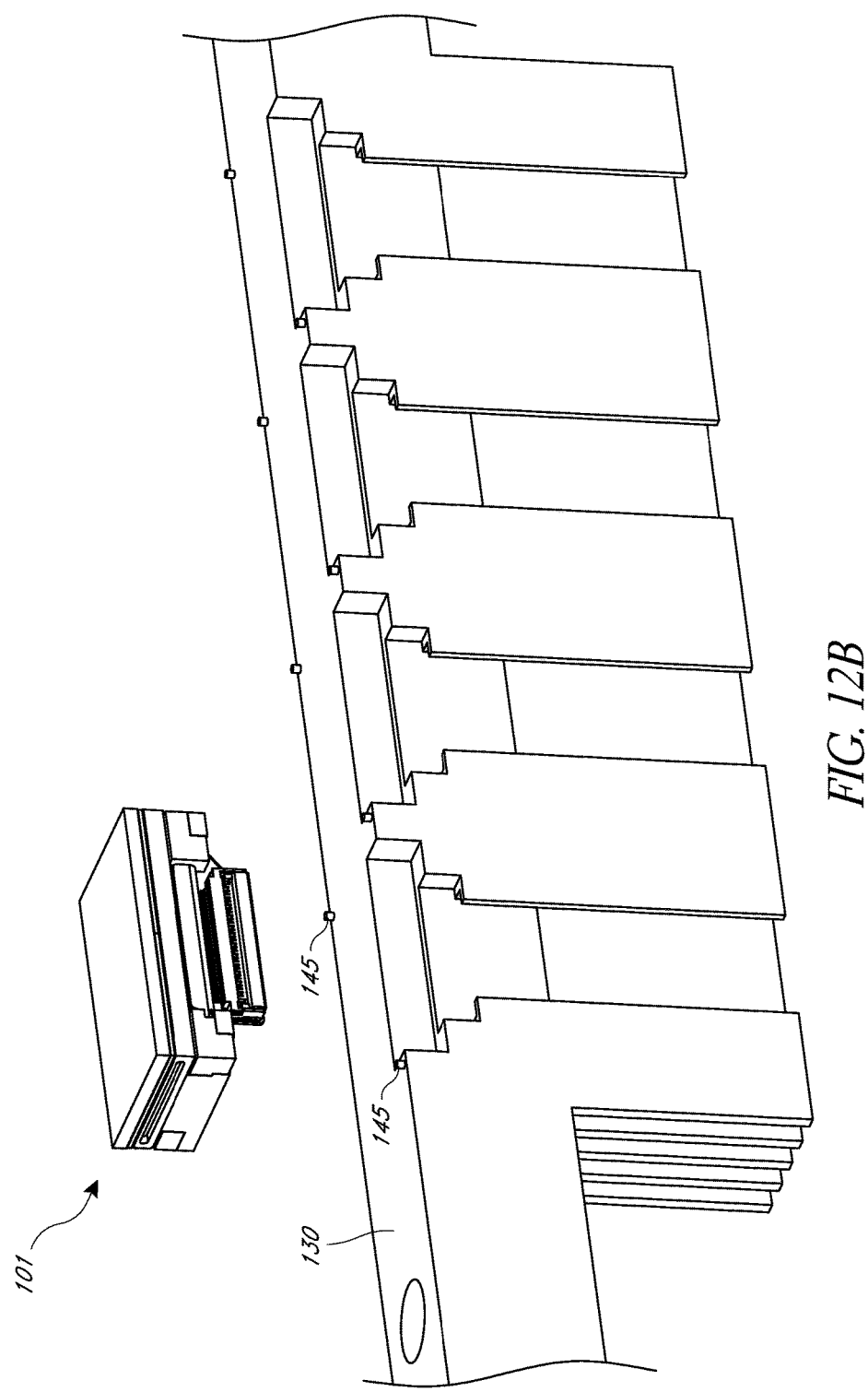
FIG. 12B is a schematic perspective view illustrating the alignment of the sensor module with the bracket of the larger imaging system.

FIG. 12A is a bottom plan view of the sensor module 101, according to some embodiments. FIG. 12B is a schematic perspective view illustrating the alignment of the sensor module 101 with the bracket 130 of the larger imaging system. It can be important to accurately and precisely align the sensor module 101 relative to the bracket 130 of the larger imaging system, so that the end user knows the relative position of the pixels of the sensor dies 102 relative to the bracket 130. In some arrangements, it can be important to ensure that the pixels are aligned relative to the system so as to be accurate to within about 100 microns. One way to align the sensor module 101 with the bracket 130 is to use cameras or other optical sensors to optically align the module(s) 101. However, such optical alignment systems may be expensive and may require sophisticated equipment and controllers. Advantageously, the embodiment of FIGS. 12A-12B allows for a simple mechanical alignment of the sensor modules 101 with the bracket 130 of the larger imaging system.

For example, as shown in FIG. 12A, one or more alignment holes 142 can be provided on the back surface of a support structure, such as the carrier 118 and heat spreader (116). The holes 142 may comprise through holes or recesses. To ensure accurate placement of the modules 101, the holes 142 may be accurately drilled using a laser; however, other ways of forming the hole 142 may be used. In the embodiment of FIG. 12A, two alignment holes 142 on diagonally opposite corners of the support structure (e.g., carrier 118) may be used. Positioning the alignment holes 142 on diagonally opposite corners of the support structure carrier 118 can enable the user to accurately align the modules 101 relative to the bracket 130 in both the X and Y directions (see FIG. 8). Each alignment hole 142 can be positioned so as to be accurately aligned with a particular designated reference pixel on the sensor dies 102. The holes 142 can be positioned at a known displacement from the reference pixel. For example, the holes 142 can be formed (e.g., laser drilled) after assembly of the sensor module 101 and can be aligned using an optical alignment technique. For example, the holes 142 can be laterally displaced (e.g., within the X-Y plane) relative to the reference pixel at a known distance at a tolerance in a range of 5 microns to 20 microns, or, more particularly, at a tolerance in a range of 10 microns to 15 microns (e.g., at a tolerance of 12.5 microns).

In some embodiments, the holes 142 may be laterally aligned in the X-Y plane (see FIG. 8) relative to the designated reference pixel such that the lateral displacement is a known predetermined distance (e.g., zero or some other suitable known distance) in the X and Y directions. The holes 142 can be laterally aligned relative to each other at a tolerance in a range of 10 microns to 40 microns, or, more particularly, at a tolerance in a range of 20 microns to 30 microns (e.g., at a tolerance of 25 microns). The tolerance of the size (e.g., diameter) of the hole 142 can be in a range of 10 microns to 40 microns, or, more particularly, at a tolerance in a range of 20 microns to 30 microns (e.g., at a tolerance of 25 microns). In some embodiments, the hole 142 can have a diameter in a range of 0.5 mm to 1.5 mm, e.g., about 1 mm. The hole 142 can have a depth in a range of 0.5 mm to 1.5 mm, e.g., about 1 mm.

Turning to FIG. 12B, the bracket 130 can include corresponding alignment pins 145 that are sized and shaped to be inserted into the alignment holes 142. Unlike a more complex optical alignment system, to align the module 101 with the bracket 130 of the larger imaging system, the end user may simply insert the alignment pins 145 of the bracket 130 into the corresponding alignment holes 142 of the modules 101, e.g. by hand and without tools. The high precision alignment pins 145 and alignment holes 142 can advantageously provide the end user with an accurate position of each pixel of the sensor dies 102 relative to the global coordinate system of the imaging system. Although the alignment holes 142 are illustrated as being formed in the carrier 118 and the pins 145 are illustrated as being formed in the bracket 130, it should be appreciated that in some embodiments, the pins 145 may be formed in or coupled with the carrier 118 and the holes 142 may be formed in the bracket 130. Thus, in various arrangements, the carrier 118 and bracket 130 can include respective male and female alignment features to align the sensor modules with the bracket 130. In some embodiments, the carrier 118 can comprise female alignment features (e.g., alignment holes) and the bracket 130 can comprise male alignment features (e.g., pins). In other embodiments, the carrier 118 can comprise male alignment features and the bracket 130 can comprise female alignment features. Furthermore, although pins and holes are illustrated herein as examples of alignment features, it should be appreciated that the shape of the alignment features may be different. For example, in some embodiments, the alignment features can comprise cross-shaped or X-shaped projections and recesses. Any other suitable shape may also be used as alignment features.

Figure 13A:
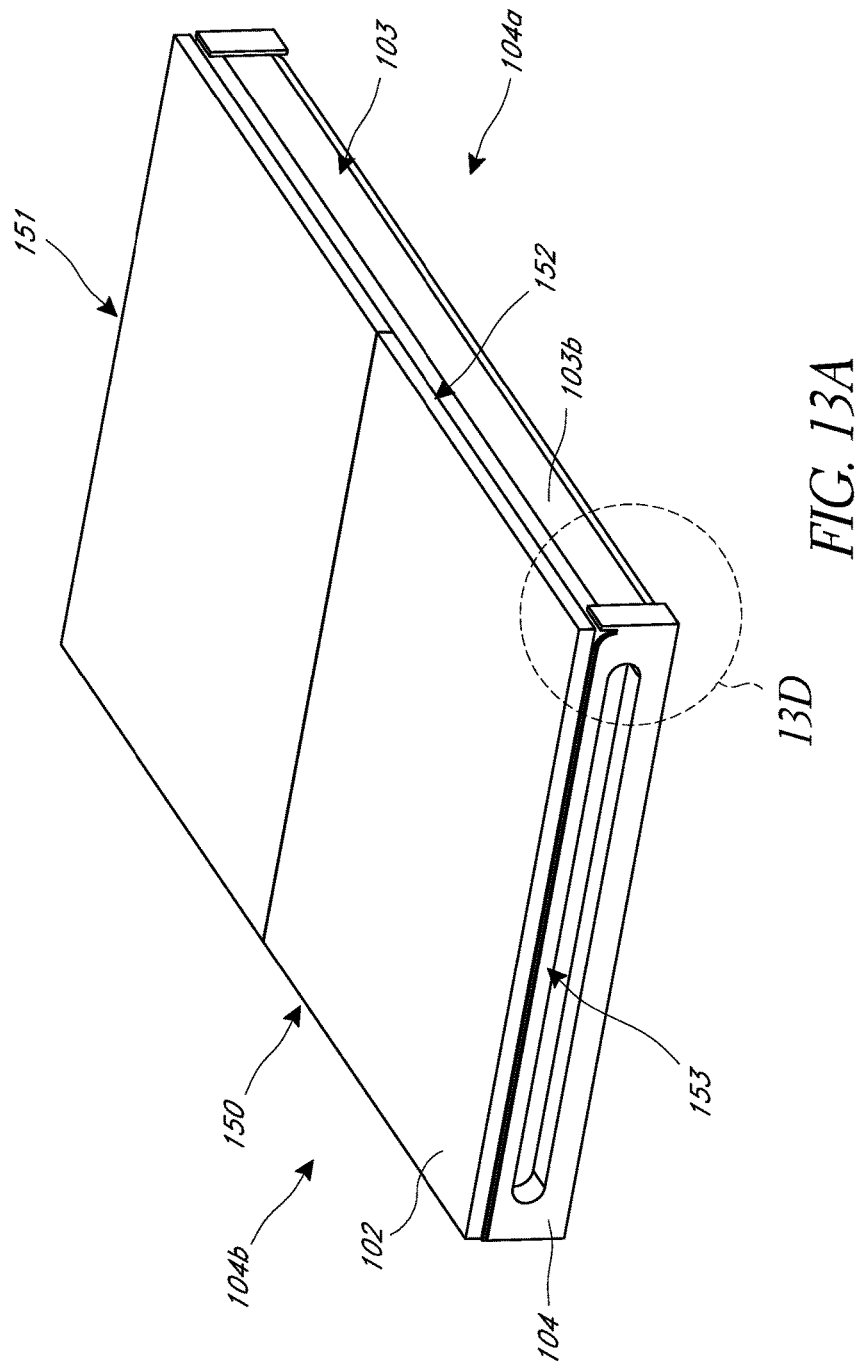
FIG. 13A is a schematic perspective view of a portion of the sensor module that illustrates sensor dies, sensor substrate, and stiffener of the module, according to some embodiments.
Figure 13B:
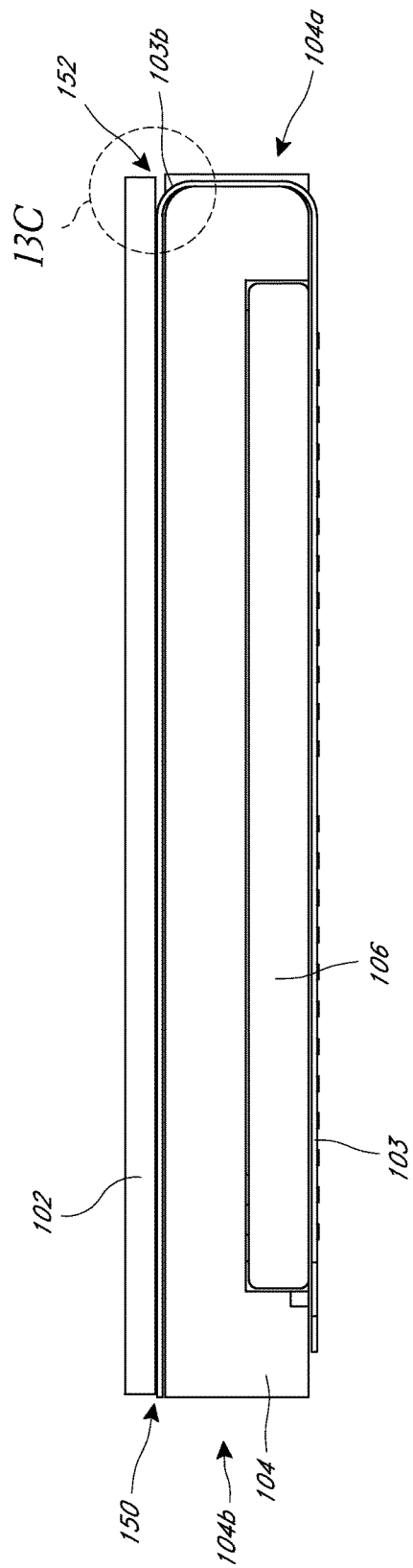
FIG. 13B is a side cross-sectional view of the portion of the sensor module shown in FIG. 13A.

FIG. 13A is a schematic perspective view of a portion of the sensor module 101 that illustrates the sensor dies 102, sensor substrate 103, and stiffener 104, according to some embodiments. FIG. 13B is a side cross-sectional view of the portion of the sensor module 101 shown in FIG. 13A. It can be important to provide a reliable electrical connection between the sensor dies 102 and the sensor substrate 103 while maintaining sufficiently small spacing between adjacent sensor modules 101, such as the adjacent modules 101 in a string 117 (see FIG. 8). In some embodiments, the sensor dies 102 can be soldered to the sensor substrate 103 using a plurality of solder balls or other interconnects. An underfill epoxy can be supplied between the sensor dies 102 and the sensor substrate 103, and can be flowed around the solder balls or interconnects to protect and enhance the reliability of the electrical connections between the dies 102 and the sensor substrate 103. In some arrangements, when the underfill epoxy is flowed between the sensor dies 102 and the substrate 103, the epoxy can squeeze out from the edges of the dies 102 and the substrate 103 and can creep upwardly along the sides of the dies 102. Such a positive epoxy edge fillet (see FIG. 13D and attendant description) can extend outwardly relative to the outer perimeter of the sensor module 101. For example, the epoxy can be seen protruding past the perimeter of the sensor dies 102 as seen from a top plan view of the module 101.

In some embodiments, the extension of a positive epoxy fillet beyond the outer perimeter of the sensor module 101 may be undesirable. For example, because surrounding sensor modules and other system components may be positioned adjacent a particular sensor module 101, it can be important to ensure that the positive epoxy fillet does not extend beyond the outer perimeter of the dies 102 or sensor substrate 103. In some arrangements, it can be desirable to ensure that the positive fillet extends less than 50 microns outside the outer perimeter of the sensor die 102. If the positive epoxy fillet extends too far outside the perimeter of the die 102, then the end user may have difficulty assembling adjacent sensor modules or other components.

Accordingly, in some embodiments, epoxy underfill can be applied between the sensor dies 102 and the sensor substrate 103 such that a negative epoxy edge fillet is created at the edges of the dies 102. Such a negative fillet can be configured to not extend outside the outer perimeter of the sensor dies 102 (for example, as seen from a top or bottom plan view), which can ensure that adjacent sensor modules may be accurately and reliably placed next to one another. In some embodiments, it may be acceptable for a fillet to extend slightly past the outer perimeter, e.g., by less than 50 microns. For example, as shown in FIG. 13A, the sensor substrate 103 can be wrapped around the first side 104a of the stiffener 104 such that a bend 103b of the substrate 103 is positioned along the first side 104a. The sensor module 101 can include a first edge 152 disposed along the length of the first side 104a of the stiffener 104 and a second edge 150 disposed along the length of the second side 104b of the stiffener 104. As shown in FIGS. 13A and 13B, the first edge 152 can be disposed adjacent the bend 103b of the substrate 103. The sensor module 101 can also include opposing third and fourth edges 151, 153 along the width of the stiffener 104.

Figure 13C:
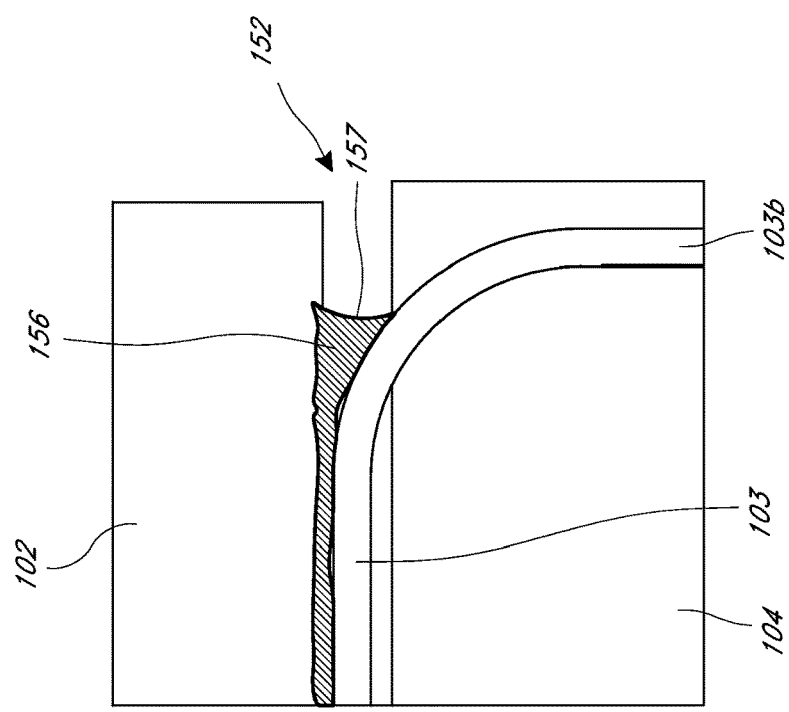
FIG. 13C is an enlarged schematic cross-sectional view showing an epoxy disposed between the sensor die and the sensor substrate and having a negative fillet at one edge.

The sensor dies 102 can be connected to the sensor substrate 103 using a plurality of interconnects, such as solder balls, and the sensor substrate 103 can be wrapped around the stiffener 104. After wrapping the sensor substrate 103 around the stiffener 104, the underfill epoxy can be dispensed between the sensor dies 102 and the sensor substrate 103 along the second edge 150, e.g., along the edge that is opposite the bend 103b of the substrate 103. Capillary action can help draw the underfill epoxy around the solder balls (or other interconnects) and can pull the epoxy to the first edge 152. FIG. 13C is an enlarged schematic cross-sectional view showing an epoxy 156 disposed between the sensor die 102 and the sensor substrate 103 and having a negative fillet 157 at the first edge 152. As shown in FIG. 13C, due to the capillary action of the flowing epoxy, the negative fillet 157 does not extend past the outer perimeter of the sensor die 102, which can help to ensure that adjacent modules can be positioned next to one another. Although not illustrated, the epoxy 156 can also have a negative fillet at the second edge 150. In other embodiments, the epoxy 156 may have a positive fillet at the second edge 150, which can be removed using a cutting device (such as a laser). As shown, the negative fillet 157 can comprise a concave outer surface, such that the curvature of the fillet 157 extends or curves inwardly between the die 102 and the substrate 103.

Figure 13D:
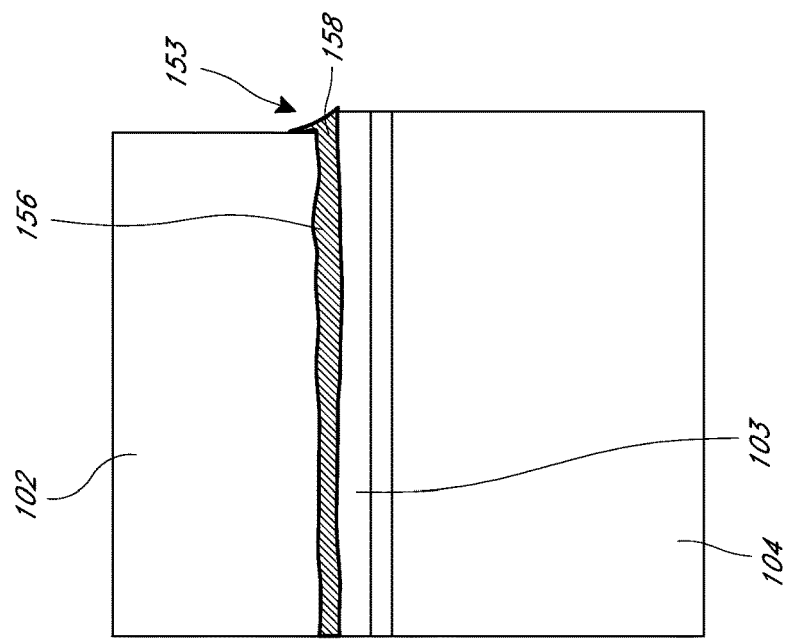
FIG. 13D is an enlarged schematic cross-sectional view showing the epoxy disposed between the sensor die and the sensor substrate and having a positive fillet at another edge.

As the epoxy 156 flows between the dies 102 and the substrate 103, some of the epoxy 156 is pushed out the edges 151, 153 that extend along the width of the sensor module 101. As the epoxy 156 is pushed outward, a positive fillet may be formed. FIG. 13D is an enlarged schematic cross-sectional view showing the epoxy disposed between the sensor die 102 and the sensor substrate 103 and having a positive fillet 158 at the fourth edge 153. Although not illustrated, a positive fillet may also be formed at the third edge 151 (FIG. 13A). As shown in FIG. 13D, the positive fillet 158 may comprise a concave surface, and the curvature of the fillet 158 can extend or curves outwardly relative to the die 102 and the substrate 103 such that the fillet 158 extends outside the perimeter of the die 102 and/or substrate 103. To ensure that adjacent sensor modules can be spaced closely together, the positive fillets 158 along the third and fourth edges 151, 153 may be cut or otherwise removed from the sensor module 101. For example, the positive fillets 158 may be laser cut from the sensor module. It should be appreciated that such a trimming process may not be desirable for the first edge 152, as any cutting device (such as a laser) may damage the underlying bend 103b of the sensor substrate 103, which can disrupt electrical communications transmitted through the substrate 103. The resulting cut surface of the epoxy may be relatively smooth or flat in some embodiments. In other embodiments, the cut surface may comprise burrs or other artifacts that evidence the use of a cutting tool, such as a saw. The cut epoxy surface may have an infinite radius of curvature in some embodiments.

In other embodiments, the sensor substrate 103 may be wrapped around both sides 104a, 104b of the stiffener 104. For example, as shown in the embodiment of FIGS. 3-4B, first and second wing segments 21, 22 of the substrate 3 may be wrapped around opposing sides of the stiffener 4 along the length of the stiffener 4. In such an arrangement, therefore, there may be two bends in the substrate which wrap around opposite sides of the stiffener. In the embodiment of FIGS. 3-4B, it may be undesirable to have a positive underfill fillet along the sides of the stiffener 4 that are adjacent and parallel to the bends of the substrate 3, because removing the fillet after the underfill may damage the substrate 3. Accordingly, in embodiments in which the substrate 3 is wrapped about opposing sides of the stiffener, it can be advantageous to supply the epoxy underfill along the two opposing edges that are transverse to the bends of the substrate, e.g., the edges which are disposed along the width of the stiffener 4. Supplying the epoxy along the two edges that are transverse to the bends of the substrate may create negative fillets along the edges that are parallel to the bends of the substrate.

FIG. 14A is an enlarged schematic side cross-sectional view of a portion of the sensor module 101, according to one embodiment. FIG. 14B is an enlarged schematic side cross-sectional view of a portion of the sensor module 101, according to other embodiments. FIGS. 14A and 14B illustrate a portion of the sensor die 102 mounted to the sensor substrate 103 by way of an adhesive 160. As explained above, the sensor substrate 103 can be wrapped about one or more sides of the stiffener 104. In the embodiment of FIG. 14A, the sensor substrate 103 includes an insulating layer 162 (which may comprise polyimide), a front conductive layer 161a disposed on a front side of the sensor substrate 103, and a rear conductive layer 161b disposed on a rear side of the sensor substrate 103. The conductive layers 161a, 161b can be patterned to form conductive traces which convey signals from the sensor dies 102 to the processor dies 109. In FIG. 14A, an inner solder mask layer 163a can be applied over the rear conductive layer 161b, and an outer solder mask layer 163b can be applied over the front conductive layer 161a. The solder mask layers 163a, 163b can be used to protect the conductive layers 161a, 161b against oxidation and to provide electrical isolation between traces. In various embodiments, the solder mask layers 163a, 163b can comprise an insulating material, such as a cured epoxy.

It may be difficult to control the thickness of the solder mask layers 163a, 163b, because the solder mask layers 163a, 163b are typically applied with a wet screen printing process that does not have sufficiently small thickness tolerances for sensor die bonding. Furthermore, the solder mask layers 163a, 163b may not be sufficiently flexible for wrapping about the stiffener. In addition, the process for attaching the sensor dies 102 to the substrate 103 may be a high temperature and/or high pressure process, which can melt the solder mask layers 163a, 163b and leave the conductive traces exposed. The solder mask layer 163a, 163b may also be too soft or weak to be applied between the adhesive 160 and the substrate 103, such that the rear conductive layer 161b is exposed directly to the adhesive 160.

Accordingly, in the embodiment of FIG. 14B, a buffer layer 164 can be applied along a rear side 165 of the sensor substrate 103, e.g., over the rear conductive layer 161b. The buffer layer 164 can be applied over the entire rear side 165 in some embodiments. The buffer layer 164 may comprise a dielectric material, such as polyimide. Other polymers may be used for the buffer layer 164, including polymers that can be processed in reel-to-reel format and/or polymers with characteristics similar to polyimide. In some embodiments, the buffer layer 164 can comprise liquid crystal polymer (LCP). The buffer layer 164 can be sufficiently strong so as to not be deformed or damaged by the adhesive 160 or the substrate 103. Moreover, the buffer layer 164 can protect the traces of the rear conductive layer 161b from stresses caused by contact between the traces and the stiffener 104, between the traces and the adhesive 160, and/or between the traces and other system components. The material properties of the buffer layer 164 can provide improved stress shielding as compared with the solder mask. Further, because the buffer layer 164 can be disposed along the entire rear side 165 of the substrate 103, the buffer layer 164 can protect the conductive layer 161b from the adhesive 160 and stiffener 104, and solder mask layers may not be omitted from the side of the substrate next to the stiffener 104.

The thickness of the buffer layer 164 may be in a range of 12.5 microns to 50 microns, or more particularly, in a range of 20 microns to 40 microns, e.g., 25 microns. The buffer layer 164 can be laminated across the back side 165 of the sensor substrate 103 and, unlike the solder mask layers, can be easily bent with the sensor substrate 103. Indeed, because the buffer layer 164 may be less stiff than the solder mask layers, the buffer layer 164 may be easily bent to conform to a desired geometry. Thus, the buffer layer 164 can provide improved stress shielding as compared to the solder mask layers because the buffer layer 164 can be disposed along the entire rear side 165 of the substrate 103. Furthermore, the buffer layer 164 can be uniformly laminated on the substrate 103 to a thickness that is substantially uniform across the entire rear side 165 of the substrate. For example, the thickness of the buffer layer 164 may vary by less than 10%, or less than 5% across the substrate 103.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A sensor module for an imaging system, the sensor module comprising:
   a sensor substrate;
   an imaging sensor die mounted on the sensor substrate, the imaging sensor die comprising a plurality of pixels on a front side of the imaging sensor die; and
   a support structure disposed behind the imaging sensor die, the support structure comprising a back side that faces away from the front side of the imaging sensor die,
   the support structure comprising an alignment feature on the back side of the support structure, the support structure having a planar portion that is generally parallel to the imaging sensor die, the support structure providing mechanical support to the sensor module, the alignment feature positioned at a fixed displacement from a reference pixel of the plurality of pixels, the alignment feature exposed on an outermost surface of the sensor module and aligned behind a back side of the imaging sensor die, wherein the alignment feature comprises an alignment hole extending into the support structure of the sensor module,
   wherein the alignment feature is configured to mechanically connect to a corresponding alignment pin of the imaging system.

2. The sensor module of claim 1, wherein the alignment feature comprises two alignment holes on opposing corners of the support structure.

3. The sensor module of claim 1, further comprising a processor substrate and one or more processor dies mounted to the processor substrate, the processor substrate wrapped around a side of the support structure.

4. The sensor module of claim 1, further comprising a stiffener and a heat spreader, the sensor substrate wrapped around a side of the stiffener, the support structure disposed between the heat spreader and the stiffener, wherein the heat spreader is directly attached to the stiffener and the support structure is not directly attached to the heat spreader or the stiffener.

5. The sensor module of claim 1, wherein the imaging sensor die comprises a photodiode array (PDA).

6. An imaging system comprising a first module comprising the sensor module of claim 1 and a bracket mechanically supporting the sensor module, wherein the bracket comprises the corresponding alignment pin such that, when the alignment feature of the first module is engaged with the corresponding alignment pin, the reference pixel is at a known coordinate in a reference system of the imaging system.

7. The sensor module of claim 1, wherein the alignment hole comprises a drilled hole.

8. The sensor module of claim 1, wherein the alignment hole is an unthreaded hole.

9. An imaging system comprising a first module comprising the sensor module of claim 1, a second module comprising the sensor module of claim 1 and a bracket mechanically supporting the first and second module, wherein the bracket comprises the corresponding alignment pins for the first and second modules such that, when the alignment features of the first and second modules are engaged with the corresponding alignment pins, the reference pixels of the first and second modules are at known coordinates in a reference system of the imaging with a tolerance less than 100 microns.

10. A sensor module for an imaging system, the sensor module comprising:
    a sensor substrate;
    an imaging sensor die mounted on the sensor substrate, the imaging sensor die comprising a plurality of pixels on a front side of the imaging sensor die;
    a support structure disposed behind the imaging sensor die, the support structure comprising a back side that faces away from the front side of the imaging sensor die, the support structure comprising an alignment feature on the back side of the support structure, the alignment feature positioned at a fixed displacement from a reference pixel of the plurality of pixels, wherein the alignment feature is configured to mechanically connect to a corresponding alignment mechanism of the imaging system;
    a plurality of interconnects electrically connecting the imaging sensor die with the sensor substrate; and
    an adhesive disposed between the imaging sensor die and the sensor substrate, the adhesive disposed around each of the interconnects,
    wherein a first portion of the adhesive is exposed along a first edge of the sensor module, the first portion comprising a negative fillet that does not extend beyond an outer perimeter of the imaging sensor die.

11. The sensor module of claim 10, wherein the negative fillet comprises a concave surface which curves inwardly between the imaging sensor die and the sensor substrate.

12. The sensor module of claim 10, wherein a second portion of the adhesive is exposed along a second edge of the sensor module, the second portion comprising a flat surface.

13. The sensor module of claim 12, wherein a third portion of the adhesive is exposed along a third edge of the sensor module, the third portion comprising a negative fillet.

14. The sensor module of claim 10, wherein the plurality of interconnects comprises a plurality of solder balls.

15. The sensor module of claim 10, further comprising a stiffener, the sensor substrate wrapped around a side of the stiffener.

16. The sensor module of claim 15, wherein the sensor substrate comprises a bend where the sensor substrate is wrapped around the stiffener, the first edge disposed adjacent to and parallel to the bend.

17. A sensor module for an imaging system, the sensor module comprising:
    a sensor substrate;
    an imaging sensor die mounted on the sensor substrate, the imaging sensor die comprising a plurality of pixels on a front side of the imaging sensor die;

a support structure disposed behind the imaging sensor die, the support structure comprising a back side that faces away from the front side of the imaging sensor die, the support structure comprising an alignment feature on the back side of the support structure, the alignment feature positioned at a fixed displacement from a reference pixel of the plurality of pixels, wherein the alignment feature is configured to mechanically connect to a corresponding alignment mechanism of the imaging system;

a stiffener, wherein the sensor substrate is wrapped around a side of the stiffener, the sensor substrate comprising a front side and a rear side, the sensor substrate comprising a dielectric buffer layer on the rear side of the sensor substrate and one or more conductive traces on the front side of the sensor substrate, and wherein the imaging sensor die is mounted to the front side of the sensor substrate; and an adhesive between the dielectric buffer layer and the stiffener.

18. The sensor module of claim 17, wherein the dielectric buffer layer comprises polyimide.

19. The sensor module of claim 17, wherein the dielectric buffer layer covers substantially the entire back side of the sensor substrate.

20. The sensor module of claim 19, further comprising a solder mask disposed on a portion of the front side of the sensor substrate but not on the rear side of the sensor substrate.

21. The sensor module of claim 17, wherein the sensor substrate comprises an insulating layer, a first conductive layer on a front side of the insulating layer, and a second conductive layer on a rear side of the insulating layer, the dielectric buffer layer disposed on the second conductive layer.

* * * * *